(12) United States Patent
Iwakiri et al.

(10) Patent No.: US 8,642,967 B2
(45) Date of Patent: Feb. 4, 2014

(54) RADIOLOGICAL IMAGE DETECTION APPARATUS AND METHOD OF MANUFACTURING THE SAME

(75) Inventors: Naoto Iwakiri, Kanagawa (JP); Haruyasu Nakatsugawa, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 13/402,803

(22) Filed: Feb. 22, 2012

(65) Prior Publication Data
US 2012/0217404 A1 Aug. 30, 2012

(30) Foreign Application Priority Data
Feb. 24, 2011 (JP) ................................. 2011-038954

(51) Int. Cl.
*G01T 1/20* (2006.01)
(52) U.S. Cl.
USPC ............................... 250/361 R; 257/E31.129
(58) Field of Classification Search
USPC ................... 250/361 R, 367, 370.11, 370.09; 257/E31.129
See application file for complete search history.

(56) References Cited

U.S. PATENT DOCUMENTS

| | | | |
|---|---|---|---|
| 6,211,532 B1 * | 4/2001 | Yagi ................................ | 257/40 |
| 7,256,404 B2 * | 8/2007 | Inoue et al. .............. | 250/370.11 |
| 2008/0011960 A1 * | 1/2008 | Yorkston et al. ......... | 250/370.09 |
| 2010/0193691 A1 | 8/2010 | Ishii et al. | |
| 2011/0006213 A1 * | 1/2011 | Sato et al. ..................... | 250/367 |

FOREIGN PATENT DOCUMENTS

| | | |
|---|---|---|
| JP | 2008-235649 A | 10/2008 |
| JP | 2009-133837 A | 6/2009 |
| JP | 2011-017683 A1 | 1/2011 |

* cited by examiner

*Primary Examiner* — David Porta
*Assistant Examiner* — Faye Boosalis
(74) *Attorney, Agent, or Firm* — Studebaker & Brackett PC

(57) ABSTRACT

A method of manufacturing a radiological image detection apparatus having: a scintillator that emits fluorescence upon exposure to radiation; and a photodetecting unit disposed on a radiation entrance side of the scintillator, the method includes: a photodetecting unit production process for layering on a substrate a protective member that exhibits low radiation absorbency than that exhibited by the substrate and forming a thin film portion that detects the fluorescence as an electric signal on the protective member, thereby producing the photodetecting unit; a substrate peel-removal process for peeling and eliminating the substrate from the protective member; and an integration process for integrating the previously-produced scintillator and the photodetecting unit before or after the substrate peel-removal process.

20 Claims, 14 Drawing Sheets

RADIOLOGICAL IMAGE DETECTION APPARATUS AND METHOD OF MANUFACTURING THE SAME

CROSS-REFERENCE TO RELATED APPLICATIONS

This application is based on and claims priority under 35 USC 119 from Japanese Patent Application No. 2011-038954 filed on Feb. 24, 2011; the entire content of which is incorporated herein by reference.

BACKGROUND

1. Technical Field

The invention relates to a radiological image detection apparatus used in a medical radiological imaging system, or the like and a method of manufacturing the same.

2. Related Art

DR (Digital Radiography) using a radiological image detection apparatus, like an FPD (Flat Panel Detector) that converts a radiological image, such as an X-ray image, into digital data, has recently been put into practice. When compared with a related art CR (Computed Radiography) system that uses an imaging plate made of a photostimulable phosphor (an accumulative phosphor), the radiological image detection apparatus has an advantage of being able to ascertain an image immediately. Thus, the DR has become proliferated rapidly.

Various types of radiological image detection apparatuses have already been put forward. One of the radiological image detection apparatuses is of a known indirect conversion type. This type of radiological image detection apparatus temporarily converts X-radiation into visible light by means of a scintillator, like a CsI: Tl scintillator and a GOS ($Gd_2O_2S$:Tb) scintillator, and a semiconductor layer converts the visible light into electric charges and accumulates the resultant electric charges (see; for instance, Patent Document 1 (JP-A-2011-17683)).

In the X-ray image detection apparatus described in connection with Patent Document 1, the scintillator is exposed to X-ray applied in the direction of the photodetecting unit. In such a configuration, a short distance exists between the principal light emission area on the X-ray entrance side of the scintillator and the photodetecting unit, so that a high resolution detected image can be acquired. In the meantime, a substrate of the photodetecting unit disposed on the X-ray entrance side of the scintillator unavoidably absorbs X-ray, which raises a problem of a decrease in the quantity of X-ray entering the scintillator.

The photodetecting unit is built by inclusion of a photodiode (PD) and a TFT (Thin Film Transistor) that each are formed from a-Si, or the like. Alkali-free glass is usually used for a substrate supporting the PD and the TFT. The reason for this is that, when soda glass is used, a-Si may be contaminated with Na that will stem from glass during formation of an a-Si film in the presence of high temperature, which may in turn deteriorate performance of an element. However, alkali-free glass is more expensive than soda glass and also absorbs a larger amount of X-ray than does the soda glass. For instance, when an X-ray shaped beam generated at a tube voltage of 50 kV is used by applying a filter having Al equivalent weight 2 mm to the photodetecting unit, an X-ray absorption factor exhibited by the alkali-free glass substrate comes to as high as 16.8%. Specifically, the light reaches the scintillator while 15% or more of X-ray with which the photodetecting unit has been irradiated is lost as a result of X-ray being absorbed by the substrate. As mentioned above, when consideration is given to maintaining the performance of the a-Si film, using alkali-free glass for the substrate is indispensable. As a result of X-ray being absorbed by the substrate, a great decline in the amount of X-ray entering the scintillator is unavoidable. Specifically, a high image quality feature that is yielded when the scintillator is exposed to X-ray emitted from the direction of the photodetecting unit is diminished.

Patent Document 2 (JP-A-2009-133837) and Patent Document 3 (JP-A-2008-235649) describe peeling and removal of the substrate after the photodetecting unit has been formed by forming a sensor on the substrate. Such a radiological image detection apparatus including the photodetecting unit that does not have the substrate can be said to be preferable as to absorption of radiation caused by the substrate.

However, in relation to the type of the radiological image detection apparatus that irradiates the scintillator with X-ray emitted from the direction of the photodetecting unit, if the substrate is peeled off from the photodetecting unit as described in connection with Patent Documents 2 and 3, new problems, such as those which will be mentioned below, may arise. Namely, damage will be inflicted on the photodetecting unit if the strength of the photodetecting unit cannot be maintained. The photodetecting unit will be corroded by moisture included in the outside air. Alternatively, performance of the scintillator will be deteriorated by moisture permeation by way of the thin photodetecting unit. A demand exists for solving these problems incidental to peeling of the substrate, to thus enhance image quality much greater.

SUMMARY

An illustrative aspect of the present invention is to provide: a radiological image detection apparatus capable of solving the drawbacks in the radiological image detection apparatus including a substrate-free photodetecting unit and reducing a degree of radiation absorbed by the photodetecting unit, thereby being able to increase an amount of radiation entering the scintillator; a manufacturing method of the radiological image detection apparatus; and an radiological imaging cassette having the radiological image detection apparatus.

According to an aspect of the invention, it is a method of manufacturing a radiological image detection apparatus having: a scintillator that emits fluorescence upon exposure to radiation; and a photodetecting unit disposed on a radiation entrance side of the scintillator, the method including: a photodetecting unit production process for layering on a substrate a protective member that exhibits low radiation absorbency than that exhibited by the substrate and forming a thin film portion that detects the fluorescence as an electric signal on the protective member, thereby producing the photodetecting unit; a substrate peel-removal process for peeling and eliminating the substrate from the protective member; and an integration process for integrating the previously-produced scintillator and the photodetecting unit before or after the substrate peel-removal process.

According to another aspect of the invention, it is a method of manufacturing a radiological image detection apparatus having: a scintillator that emits fluorescence upon exposure to radiation; and a photodetecting unit disposed on a radiation entrance side of the scintillator, the method including: a photodetecting unit production process for layering on a substrate a protective member that exhibits low radiation absorbency than that exhibited by the substrate and forming a thin film portion that detects the fluorescence as an electric signal on the protective member, thereby producing the photodetecting unit; a scintillator production process for forming the scintillator on the thin film portion of the photodetecting unit and placing a support member on another side of the scintillator with respect to its side facing the thin film portion; and a substrate peel-removal process for peeling and eliminating the substrate from the protective member integrated with the scintillator in the scintillator production process.

According to another aspect of the invention, it is a radiological image detection apparatus including: a scintillator that emits fluorescence upon exposure to radiation; and a photodetecting unit disposed on a radiation entrance side of the scintillator, in which: the photodetecting unit includes a protective member formed from a low radiation absorbent material that exhibits low radiation absorbency than that exhibited by a glass material and a thin film portion that is formed on a side of the protective member facing the scintillator and that detects the fluorescence as an electric signal.

According to another aspect of the invention, it is a radiographic imaging cassette including; the radiological image detection apparatus; a housing that houses the radiological image detection apparatus, in which: the housing has a top plate on which a subject is to be put in such a way that the thin film portion opposes a back side of the top plate by way of the protective member.

With the processes or configurations discussed above, the photodetecting unit has the protective member. Even if the substrate of the photodetecting unit is peeled off, the thin film portion will be protected. The presence of such a protective member enables protection of the thin film portion from moisture in the outside air, a load, or the like. Specifically, the drawbacks owing to peeling of the substrate from the photodetecting unit are solved. Accordingly, the image quality enhancement effect yielded by the configuration in which the scintillator is exposed to radiation applied from the direction of the photodetecting unit can be sufficiently exerted. In addition, a protective member having a low radiation absorption factor is used. Hence, absorption of radiation achieved at the radiation entrance side of the scintillator can be suppressed to the least possible extent, whereupon the quantity of radiation entering the scintillator increases. Consequently, maximization of image quality of a detected image can be implemented. Furthermore, the protective member is sandwiched between the substrate and the thin film portion during manufacture of the radiological image detection apparatus, deterioration of performance of the thin film portion, which would otherwise be caused by the influence of the substrate (sodium contamination, or the like) can be prevented. In connection with the above, further enhancement of image quality can be achieved by the configuration in which radiation enters the scintillator by way of the photodetecting unit.

BRIEF DESCRIPTION OF THE DRAWINGS

FIG. 12 is a side cross sectional view showing an example modification of a protective film made of parylene, or the like;

DETAILED DESCRIPTION

Figure 1:
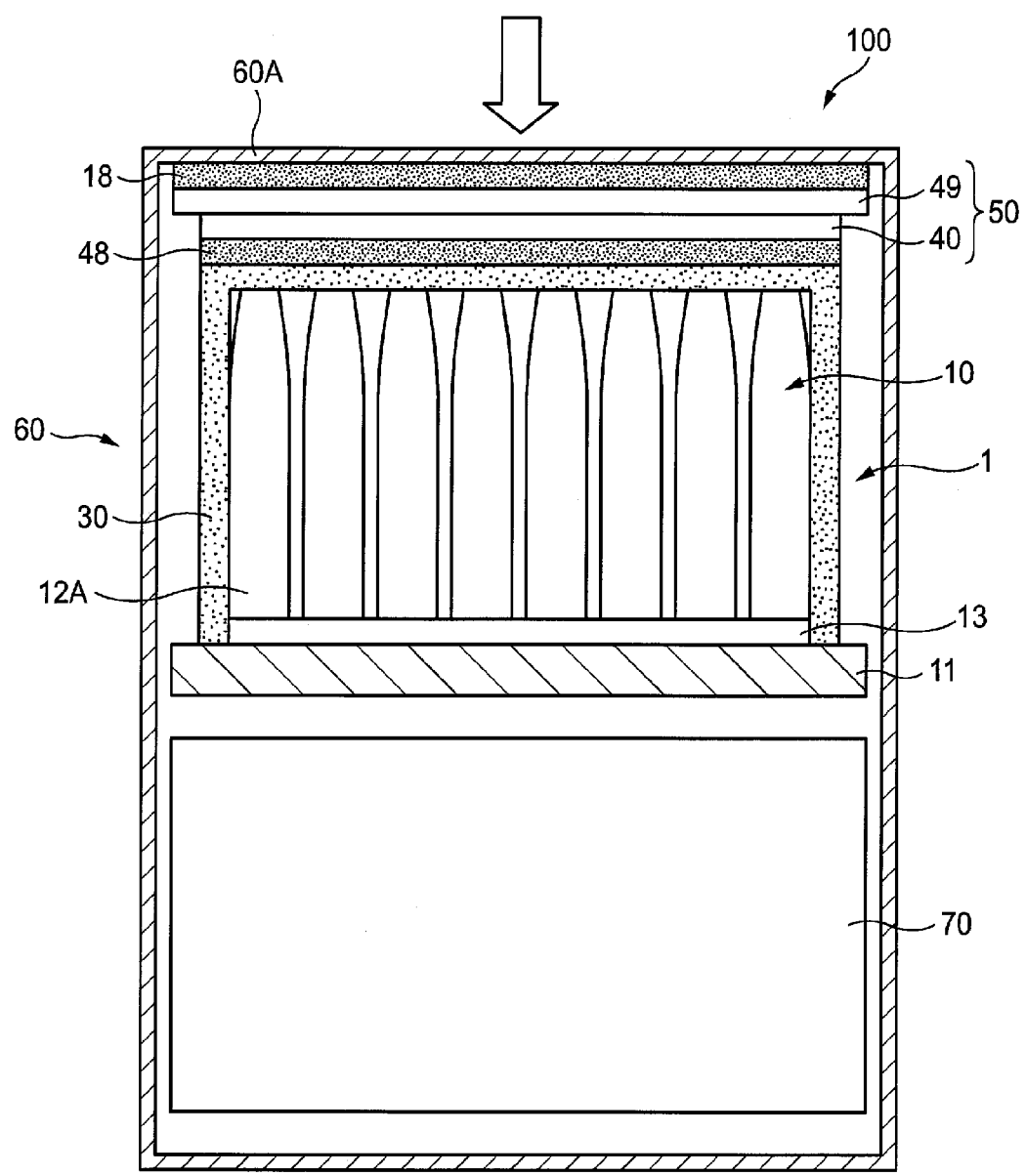
FIG. 1 is a side cross sectional view schematically showing a general configuration of an X-ray imaging cassette.

An example X-ray image detection apparatus for explaining an embodiment of the present invention is hereunder described by reference to FIGS. 1 through 10.

A configuration analogous to the previously-described configuration is assigned the same reference numerals, and its repeated explanations are omitted or simplified for brevity.

1. Overall Configuration

FIG. 1 is a side cross sectional view schematically showing a general configuration of an X-ray imaging cassette 100 of indirect conversion type. The cassette 100 has an X-ray image detection apparatus 1 and a housing 60 for accommodating the X-ray image detection apparatus 1. The X-ray image detection apparatus 1 is equipped with a scintillator 10 that includes a fluorescent material which emits fluorescence upon exposure to X-ray (indicated by an outlined arrow shown in FIG. 1); a photodetecting unit 50 that is disposed on an X-ray entrance side of the scintillator 10 and that detects the fluorescence emitted from the scintillator 10 as an electric signal; and a control module 70 that is disposed opposite the X-ray entrance side of the scintillator 10.

The control module 70 includes a circuit board on which there are implemented an IC serving as a control block for activating and controlling the photodetecting unit 50, an IC for processing an image signal, and the like, and a power circuit. The control module 70 is assembled, in an integrated manner, into the scintillator 10 and the photodetecting unit 50.

The housing 60 accommodates the scintillator 10, the photodetecting unit 50, and the control module 70. A thickness of the scintillator 10 and a thickness of the photodetecting unit 50 are smaller when compared with those shown in FIG. 1 that is a schematic diagram; hence, the housing is also formed thinner than its counterpart shown in FIG. 1. Therefore, the housing 60 has a top plate 60A on which a subject is to be put, and the X-ray image detection apparatus 1 is disposed in such a way that the photodetecting unit 50 opposes a back side of the top plate 60A.

2. Configuration of Photodetecting Unit

Figure 2:
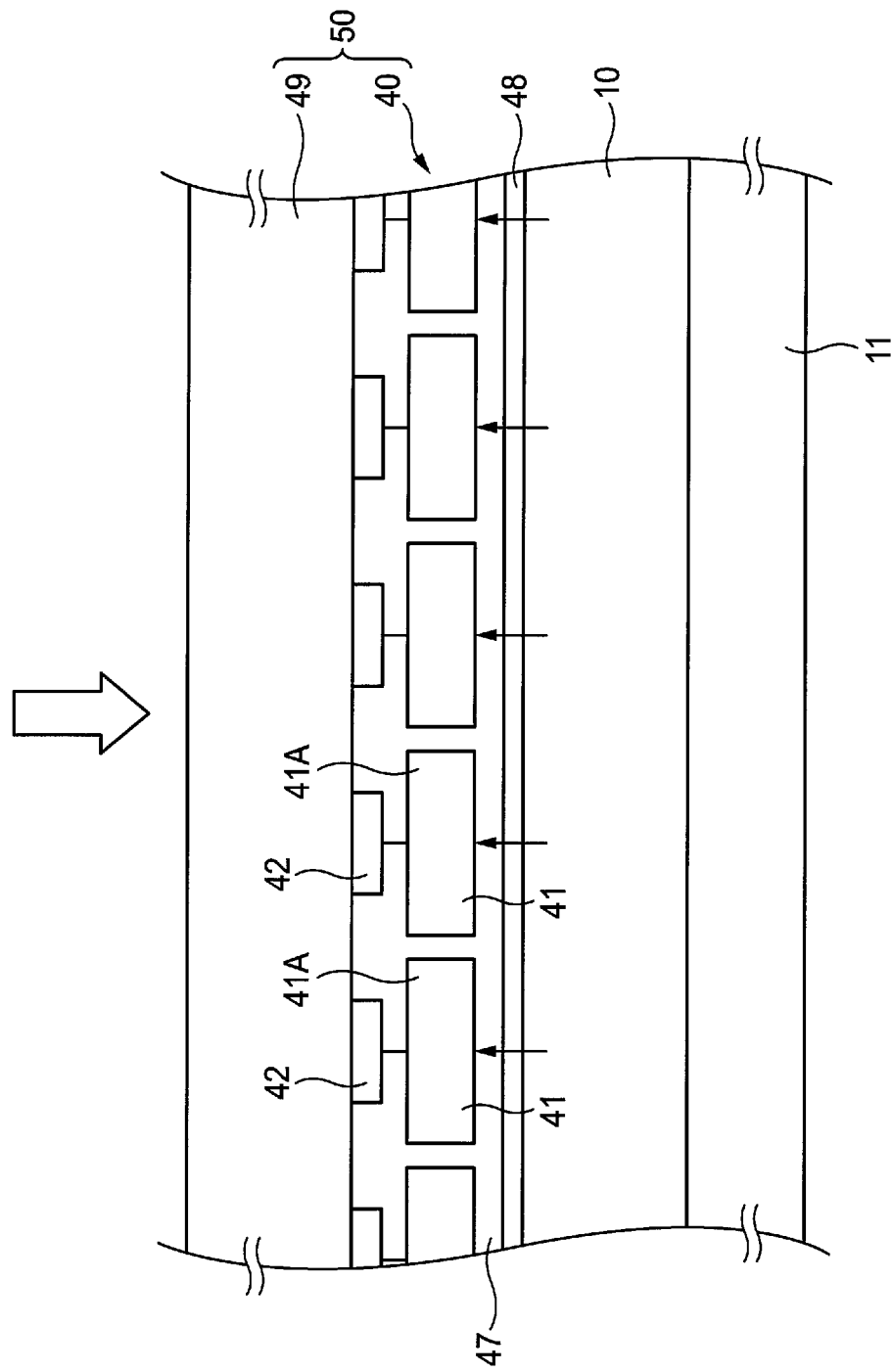
FIG. 2 is a side cross sectional view schematically showing a general configuration of a photodetecting unit.
Figure 3:
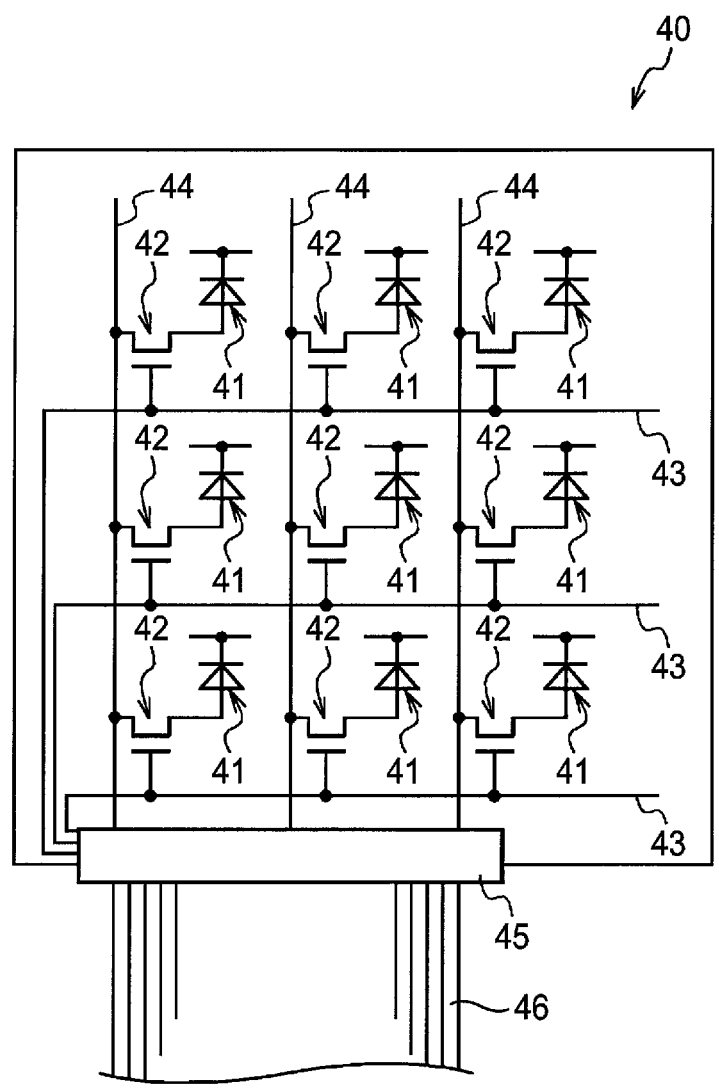
FIG. 3 is a plan view schematically showing a configuration of the photodetecting unit.

FIG. 2 is a side cross sectional view schematically showing the photodetecting unit 50. FIG. 3 is a plan view schematically showing a configuration of the photodetecting unit 50 in which elements are arranged in a two dimensional layout.

The photodetecting unit 50 has a protective member 49 and a thin film portion 40 formed on the protective member 49.

(Configuration of the Thin Film Portion)

The thin film portion 40 includes PDs (Photodiode) 41 made of a-Si, or the like, and TFTs 42 that are thin film switching elements made of a-Si, or the like. As shown in FIG. 2, the PDs 41 and the TFTs 42 are respectively stacked one on top of the other in a thicknesswise direction of the photodetecting unit 50.

The PD 41 has a photoconductive layer that converts the light (designated by an arrowhead solid line in FIG. 2), which has entered by way of the scintillator 10, into electric charges. Each of the PDs 41 is arranged so as to correspond to a pixel of an image detected by the photodetecting unit 50.

As shown in FIG. 3, each of the PDs 41 is equipped with the TFT 42, a gate line 43, and a data line 44. The respective gate lines 43 and the respective data lines 44 are extended to a connection terminal 45 and further connected to a circuit board of the control module 70 by way of flexible wiring 46, like an anisotropic conductive film connected to the connection terminal 45. The respective TFTs 42 are switched ON and OFF on a per-column basis by means of a control signal transmitted from a control block implemented on the circuit board by way of the gate lines 43. By way of the data lines 44, a signal processing block on the circuit board reads, as image signals, electric charges in the respective PDs 41 whose corresponding TFTs 42 remain in an ON position. The electric charges in the respective PDs 41 are sequentially read on a per-column basis, whereby a two-dimensional image is detected.

In FIG. 2, both sides of the photodetecting unit 50 in its thicknesswise direction are made smooth by means of a planarizing layer (a film made of a resin) 47. It is preferable to provide the photodetecting unit 50 with the planarizing layer 47. However, the planarizing layer 47 may also be omitted.

The photodetecting unit 50 is bonded to the scintillator 10 by way of an adhesive layer 48.

Neither the adhesive layer 48 nor the planarizing layer 47 may be interposed between the scintillator 10 and the photodetecting unit 50. The scintillator 10 may also be pressed against and brought into close, direct contact with the surface of the photodetecting unit 50.

In relation to a resin that makes up the planarizing layer and the adhesive layer interposed between the photodetecting unit 50 and the scintillator 10 and a resin layer which is a transparent liquid or gel making up a matching oil layer, specific restrictions are not imposed on the resin, so long as the resin enables scintillation light emitted from the scintillator 10 to arrive at the photodetecting unit 50 without undergoing substantial attenuation.

Polyimide, parylene, or the like, can be used as a resin that makes up the planarizing layer, and polyimide that exhibits ease of film formation is preferable.

A preferable adhesive to be used for making up the adhesive layer is one that exhibits optical transparency to the scintillation light emitted from the scintillator 10; for instance, a thermoplastic resin, a UV curable adhesive, a heat curing adhesive, a room-temperature curing adhesive, a two-sided adhesive substrate, and the like. From the viewpoint of prevention of deterioration of a degree of image sharpness, using an adhesive made of a low-viscosity epoxy resin is preferable because the epoxy resin can form an adhesive layer that is sufficiently thin with respect to a pixel size of the photodetecting unit 50.

A thickness of an adhesive layer made of a resin, such as a planarizing layer and an adhesive layer is preferably 50 micrometers or less from the viewpoint of sensitivity and image quality. More preferably, the thickness falls within a range from 5 micrometers to 30 micrometers.

(A Configuration of the Protective Member)

The protective member 49 is disposed on the X-ray entrance side of the thin film portion 40. The protective member 49 is made of a low X-ray absorbent material that exhibits an X-ray absorbency which is lower than that exhibited by a glass material and that is lower than a substrate 51 to be described later in terms of the X-ray absorbency. An Al equivalent weight of the protective member 49 with respect to X-ray generated by a tube voltage of 60 kV is under 1.8 mm.

Here, the Al equivalent weight is an index that shows a thickness of an aluminum plate (purity 99% or more) achieved when the X-ray absorbency is compared with transparency of aluminum. When the Al equivalent weight is measured, a member that is a test target is typically placed at a position spaced apart from the X-ray source by 1 to 2 meters, and the quantity of X-ray passed through the member is measured without involvement of an obstacle between the X-ray source and the member. Depending on a usage condition of the X-ray image detection apparatus, another member that absorbs X-ray is conceived to be placed on the X-ray entrance side of the protective member 49. Therefore, the Al equivalent weight of the protective member 49 (at a tube voltage of 60 kV) is preferably 1.0 mm or less in consideration of a total quantity of X-ray absorbed by the member and the protective member 49.

In the meantime, the protective member 49 is for supporting the thin film portion 40 and hence requires given strength. Allowing for this point and the reduction in an exposure dose of the subject, a preferable Al equivalent weight of the protective member 49 against X-ray generated at a tube voltage of 60 kV preferably ranges from 0.1 mm to 1.0 mm.

Although the X-ray absorbing capacity of the protective member is herein defined as an Al equivalent weight against X-ray generated at a tube voltage of 60 kV as mentioned above, it goes without saying that an Al equivalent weight against X-ray generated at a tube voltage other than 60 kV (e.g., 80 kV) can be calculated from the Al equivalent weight acquired under the aforementioned requirements. Absorbency of X-ray can be tested in conformance with the standards of JESRA (Japan Engineering Standards for Radiation Apparatus). For instance, measurement of an Al equivalent weight can also be performed at 80 kV, 2 mA, and 40 sec. that are analogous to the requirements stipulated by JESRA.

Moreover, when the X-ray imaging cassette is made as a result of the X-ray image detection apparatus 1 being accommodated in the housing 60 as shown in FIG. 1, an Al equivalent weight (a tube voltage of 60 kV) achieved when both the top plate 60A of the housing 60 and the protective member 49 are used is preferably under 1.8 mm More preferably, the Al equivalent weight ranges from 0.1 mm to 1.0 mm The Al equivalent weight (at a tube voltage of 60 kV) achieved when both the top plate 60A of the housing 60 and the protective member 49 are used may be measured on the basis of the quantity of X-ray achieved after X-ray emitted from the X-ray source has passed through the top plate 60A and the protective member 49 in sequence while the top plate 60A and the protective member 49 remain stacked one on top of the other. Alternatively, the Al equivalent weight achieved by means of the top plate 60A and the Al equivalent weight achieved by means of the protective member 49 may be separately measured, and a total of measurement values may also be determined.

The Al equivalent weight achieved by means of the protective member 49 and the Al equivalent weight achieved by means of the top plate 60A are respectively determined in consideration of energy of X-ray applied. In the case of; for instance, mammographic applications, the energy of X-ray applied is usually as low as 28 keV or thereabouts. When compared with a case where X-ray having a higher energy is applied, it is preferable that the Al equivalent weight of the protective member 49 and that of the top plate 60A be set to a relatively lower value.

As long as the Al equivalent weight of the protective member 49 against X-ray generated at a tube voltage of 60 kV is under 1.8 mm, any specific limitations are not imposed on a low X-radiation absorbent material used for making up the protective member 49. However, using metal (including a metallic compound and an alloy) and/or a resin is preferable. Preferable metal includes at least one of single metals, such as Al, Mg, Cr, Zr, Ti, and Mn, oxides thereof, and metal alloys of thereof. Corrosion resistance of the thin film portion 40 can be enhanced by employing at least any one of Mg, Cr, Zr, Ti, and Mn as a metallic material of the protective member 49. Corrosion resistance of the thin film portion 40 can be enhanced by using for the protective member 49 an aluminum alloy including at least any one of; for instance, Mg, Cr, Zr, Ti, and Mn. Alumina ($Al_2O_3$), or the like, is formed over a surface of the aluminum alloy by means of surface treatment of such an aluminum alloy, whereby corrosion resistance of the thin film portion 40 can be enhanced still further.

A preferable resin is at least one of polyimide, polyethylene naphthalate, polystyrene, and aramid (all aromatic polyamides). Single resin films that can be used for the protective member 49 include; for instance, a transparent polyimide film, a polyallylate (PAR) film, an OPS (registered trademark) film (a polystyrene film), an aramid film, and the like. All of these films yield an advantage of a low X-ray absorbency and high heat resistance. Products manufactured by Tosoh Corporation and products manufactured by Asahikasei Chemicals Corporation are referred to as the OPS film, and these films exhibit an advantage of superior mechanical strength (stiffness) and low water absorption. Superior mechanical strength is advantageous to support the thin film portion 40 after peeling of the substrate 51. Moreover, low water absorption is advantageous to prevent corrosion and deterioration of the thin film portion 40 and the scintillator 10.

In relation to a heat resistant temperature of the protective member 49, the transparent polyimide film has a heat resistant temperature of about 300 degrees centigrade; the polyallylate film has a heat resistant temperature of about 175 degrees centigrade; the OPS film has a heat resistant temperature of about 250 degrees centigrade; and the aramid film has a heat resistant temperature of about 200 degrees centigrade or more. These high heat resistant temperatures are particularly effective in a case (see FIG. 13) where the scintillator is deposited on the protective member 49.

Figure 11:
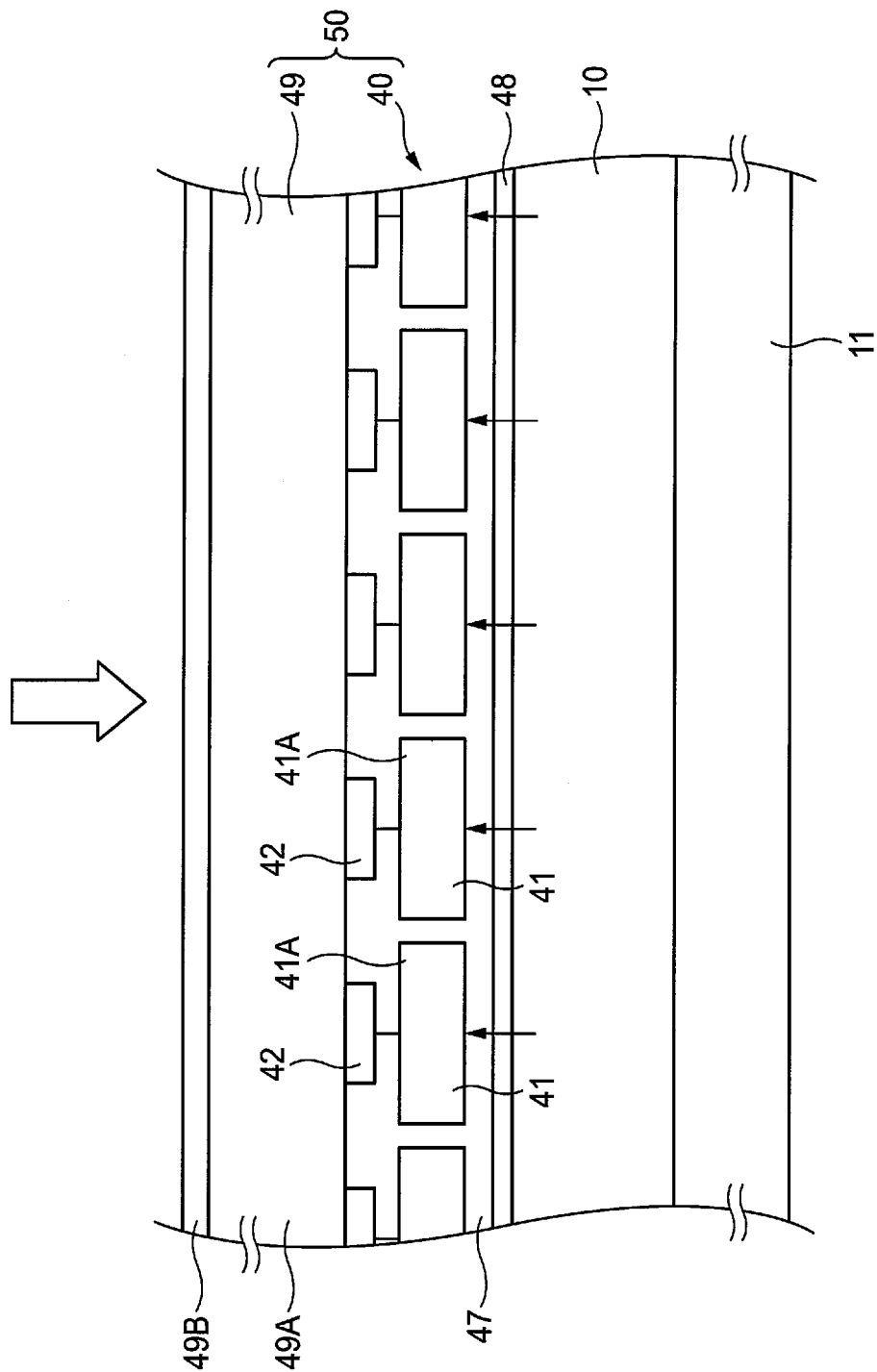
FIG. 11 is a side cross sectional view showing an example modification of a protective member.

The protective member 49 can be formed from only metal or a resin or a combined use of metal and a resin, like a resin including dispersed metal particles. Further, the protective member 49 may be formed into a single layer or two or more layers as illustrated in FIG. 11. Furthermore, the protective member 49 is preferably a light reflecting member that reflects fluorescence emitted from the scintillator 10.

Depending on a low X-ray absorbent material making up the protective member 49, a preferable thickness of the protective member 49 usually ranges from 0.01 mm to 1 mm. So long as the thickness of the protective member 49 is made smaller than the thickness of the substrate 51 to be described later, the distance between the subject placed on the top plate 60A and the thin film portion 40 can be made shorter, so that enhancement of image quality can be promoted.

A plurality of PDs 41 and a plurality of TFTs 42 that make up the thin film portion 40 are fabricated on the protective member 49 by means of photoetching processes, or the like. No adhesive layer exists between the thin film portion 40 and the protective member 49, and the thin film portion 40 remains in close contact with a surface of the protective member 49.

Figure 7:
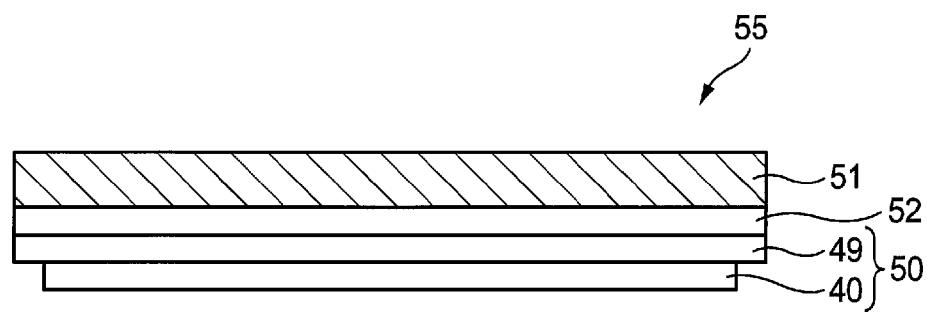
FIG. 7 is a side cross sectional view schematically showing a configuration of the photodetecting unit achieved before peeling of a substrate.

Incidentally, in the process for manufacturing the X-ray image detection apparatus 1 to be described later, the thin film portion 40 is formed on the other side of the protective member 49 with respect to its side facing the substrate 51 while the protective member 49 remains layered on the substrate 51 (FIG. 7). Subsequently, the protective member 49 is peeled off from the substrate. Put another way, the substrate 51 is peeled off and taken away from the protective member 49. The other side of the protective member 49 with respect to its side on which the thin film portion 40 is formed corresponds to the peel side of the protective member 49 achieved when the protective member 49 is peeled off from the substrate 51. As a result of removal of the substrate 51, the quantity of X-ray entering the scintillator 10 increases. In the state in which the substrate 51 is peeled off, the thin film portion 40 is supported by the protective member 49.

The substrate 51 is an ancillary member for making up the protective member 49 and is to be peeled at some stage. For this reason, as a matter of course, a material of the substrate 51 can be appropriately determined without taking into account X-ray absorption. The thin film portion 40 is formed on the protective member 49 and does not undergo adverse effect of the material of the substrate 51; namely, sodium contamination. Hence, using inexpensive soda glass for the substrate 51 can also be contemplated.

Since absorption of X-ray caused by the substrate 51 does not need to be taken into account, it is possible to assure sufficient ease of handling during manufacture by increasing the thickness of the substrate 51.

Moreover, since substrate peeling makes it possible to recycle the thus-peeled substrate 51, cost cutting becomes possible.

While the foregoing effect resulting from substrate peeling is being yielded, the thin film portion 40 can be reinforced as a result of the protective member 49 being provided on the thin film portion 40. Therefore, strength required during manufacture or use of the X-ray imaging cassette 100 can be assured. Since the X-ray imaging cassette 100 will undergo drop impact with high probability, assuring impact resistance is important. Moreover, assuring withstand load against a load exerted by the cassette top plate 60A is also important.

As a result of the protective member 49 being provided on the thin film portion 40, the thin film portion 40 and the scintillator 10 are made resistant to moisture, such as a water content in the outside air. Accordingly, corrosion of the thin film portion 40 and deterioration of performance of the scintillator 10 can be prevented.

Although the protective member 49 may also be provided one for a plurality of pixels, applying the protective member 49 over the entirety of the thin film portion 40 in an integrated fashion is preferable from the viewpoint of reinforcement.

As mentioned above, light metal, like aluminum, or a resin can be used as a material of the protective member 49. When the protective member 49 is formed from aluminum and acts as a light reflection member, the light fell on the protective member 49 after having passed through the PDs 41 can be reflected toward the PD 41. The amount of light incident on the PDs 41 is thereby increased, so that detection sensitivity can be enhanced.

When metal, such as aluminum, is used for the protective member 49 for the purpose of forming the protective member 49 as a reflection member, a metallic member is higher than a glass substrate in terms of thermal conductivity. Hence, unevenness in image, which would otherwise be caused by propagation of heat from the subject to the photodetecting unit 50, can be prevented. Specifically, thermal unevenness (heat unevenness) in a glass member supporting the photodetecting unit would cause unevenness in temperature of the PDs 41 in an image formation region, which would in turn cause unevenness in performance. For these reasons, a metallic member exhibiting superior thermal conductivity is employed as a protective member, whereby image quality can be enhanced.

When the protective member 49 is made of single metal, like aluminum, or its alloy, the protective member 49 exhibits a high effect of sealing the thin film portion 40. Specifically, airtightness and watertightness of the thin film portion 40 become easy to assure by use of such a protective member 49. Accordingly, deterioration of performance of the scintillator 10, which would otherwise be caused by moisture absorption, can be sufficiently prevented.

3. Configuration of Scintillator

The scintillator 10 is deposited on a support 11 that is made of a material, such as aluminum, which reflects light. The support 11 is not restricted to a plate made of aluminum. Any material for the support 11 can be appropriately selected from a carbon plate, CFRP (Carbon Fiber Reinforced Plastic), a glass plate, a quartz plate, a sapphire plate, and others. The support 11 is not limited particularly to these plates, so long as a scintillator is formed over the surface of the support. However, when the support 11 doubles also as a light reflection member, it is better to use light metal, such as aluminum, for a material of the support. Since the support 11 is placed on the other side of the X-ray image detection apparatus 1 with respect to its X-ray entrance side, the support 11 can be formed from a material that exhibits low X-ray transmissivity.

Here, the support 11 is not indispensable for the X-ray image detection apparatus 1. Specifically, after a scintillator has been formed and deposited over the support 11, the scintillator can be used while peeled off from the support 11. A light reflection member can also be provided on the other side of the scintillator 10 with respect to its side facing the photodetecting unit 50.

The scintillator 10 is covered with a protective film 30 made of parylene, or the like. The protective film 30 is formed by means of a vapor phase deposition technique and seals the scintillator 10 on the support 11. The protective film made of parylene by means of vapor phase deposition exhibits superior flexibility as well as superior adhesion with respect to the scintillator 10. Hence, the protective film exhibits superior followability to warpage, or the like, in the support 11 and the protective member 49.

So long as the scintillator is protected from moisture by another means, such as wrapping the scintillator 10 with a damp-proof film in an airtight and watertight manner, the protective film 30 may be omitted.

The scintillator 10 is made up of a group of columnar crystals formed by letting a fluorescent material grow into a columnar shape, CsI:Tl (thallium activated cesium iodide) is used as a fluorescent material. In addition, NaI:Tl (thallium activated sodium iodide), CsI:Na (sodium activated cesium iodide), or the like, can also be used as a fluorescent material for the scintillator 10. Using CsI:Tl for a material is preferable in that a luminescence emission spectrum conforms to a local maximum value (around 550 nm) of spectrum sensitivity of an a-Si photodiode.

It is also possible that the scintillator 10 will not include any columnar crystals. Further, the scintillator can also be formed by coating the support with; for instance, GOS [$Gd_2O_2S$:Tb (terbium activated gadolinium oxysulfide)].

Now, it is desirable that the scintillator 10 be formed by means of vapor phase deposition. A general description of vapor phase deposition is as follows. Namely, CsI that is a base material is heated in a resistance heating crucible in an environment, or at a vacuum degree of 0.01 to 10 Pa, by means, like energization, until CsI is evaporated. Likewise, Tl serving as an activator is heated in the resistance heating crucible in the environment, or at a vacuum degree of 0.01 to 10 Pa, by means, like energization, until Tl is evaporated. The temperature of the support 11 is set to a room temperature (20 degrees centigrade) to 300 degrees centigrade, whereby CsI:Tl is deposited on the support 11. A shape, size, and porosity of the crystal of the scintillator 10 can be controlled by changing the degree of vacuum, the temperature of the support, a deposition rate, or the like.

Figure 4:
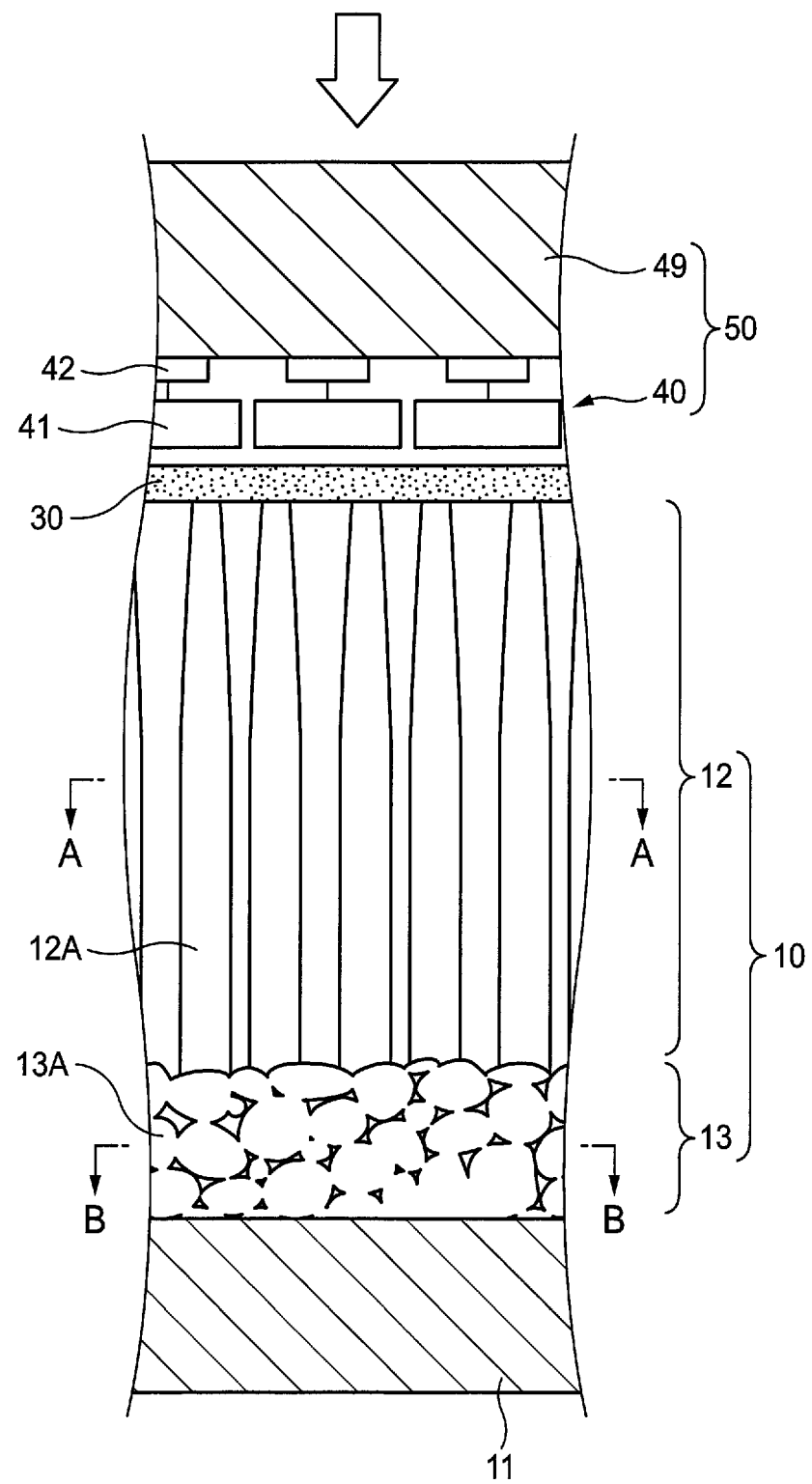
FIG. 4 is a side cross sectional view schematically showing a crystalline structure of a scintillator.

FIG. 4 is a side cross sectional view schematically showing a crystalline structure of the scintillator 10. The scintillator 10 includes a columnar portion 12 formed from a group of columnar crystals 12A and a non-columnar portion 13 including non-columnar crystals 13A formed at a base end of the columnar crystals 12A.

Fluorescent emitted from the scintillator 10 when the scintillator is exposed to X-ray is guided by the columnar crystal 12A in its heightwise direction (a direction of crystal growth), to thus enter the photodetecting unit 50. The light propagated toward the support 11 is, at this time, reflected by the non-columnar portion 13 and the support 11, thereby entering the photodetecting unit 50.

[A Configuration of the Columnar Portion]

The columnar portion 12 is an aggregate of the plurality of columnar crystals 12A. In the example shown in FIG. 4, the respective columnar crystals 12A stand substantially upright on the support 11. Leading ends of the columnar crystals 12A are formed into a pinched shape. The leading ends of the respective columnar crystals 12A can also be abraded. The plurality of columnar crystals 12A oppose one pixel (one PD 41) of the photodetecting unit 50.

The columnar crystals 12A are superior to non-columnar crystals in terms of a crystalline property and emit larger quantities of fluorescence. The columnar crystals 12A adjoining each other by way of voids stand upright in the thicknesswise direction of the scintillator; accordingly, the columnar crystals 12A act as a light guide, to thus guide light in a heightwise direction of the columns Since the light guide effect of the columnar crystals 12A prevents scattering of light, which would arise among the pixels, a detected image can be made sharp.

Figure 5:
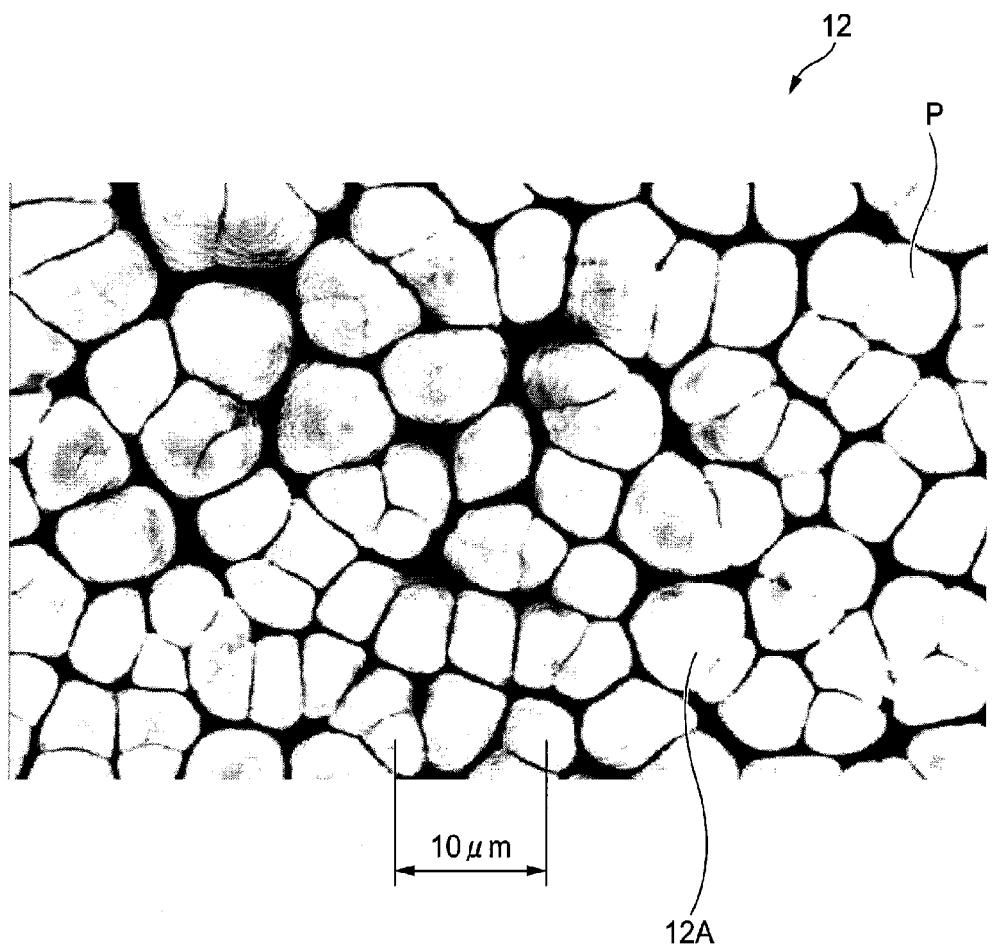
FIG. 5 is an electron microscope photograph (an SEM image) showing a cross section of a columnar crystal of the scintillator.

FIG. 5 is an electron microscope photograph showing the columnar portion 12 taken along cross section A-A shown in FIG. 4 (i.e., a cross section of the columnar portion 12 achieved at substantially a center in its heightwise direction). Voids (looked densely in FIG. 5) exist among the adjacent columnar crystals 12A. The columnar crystals 12A have a substantially uniform cross-sectional diameter with respect to the direction of crystal growth. The adjacent columnar crystals 12A join to each other in a part of an area of the columnar portion 12, thereby making up an integrated columnar body (see; for instance, reference symbol P in FIG. 5).

In consideration of X-ray absorbing capacity commensurate with required sensitivity, the thickness of the columnar portion 12 is set to a value of about 200 micrometers for mammographic applications and a value of 500 micrometers or more for general photographing. However, when the columnar portion 12 is too thick, the usage efficiency of fluorescence will be likely to decrease because of light absorption or scattering. For this reason, the thickness of the columnar portion 12 is set to an appropriate value in consideration of sensitivity and the usage efficiency of fluorescence.

[A Configuration of the Non-Columnar Portion]

The non-columnar portion 13 includes substantially spherical or indefinite-form non-columnar crystals 13A. The non-columnar portion 13 often includes an amorphous (non-crystalline) portions.

A preferable shape of the non-columnar crystals 13A is a substantially spherical shape in terms of voids being easily held among crystals and the capability of enhancing reflection efficiency. Specifically, it is preferable that the non-columnar portion 13 will be formed from an aggregate of substantially spherical crystals (the non-columnar crystals 13A that are substantially spherical crystals).

Figure 6:
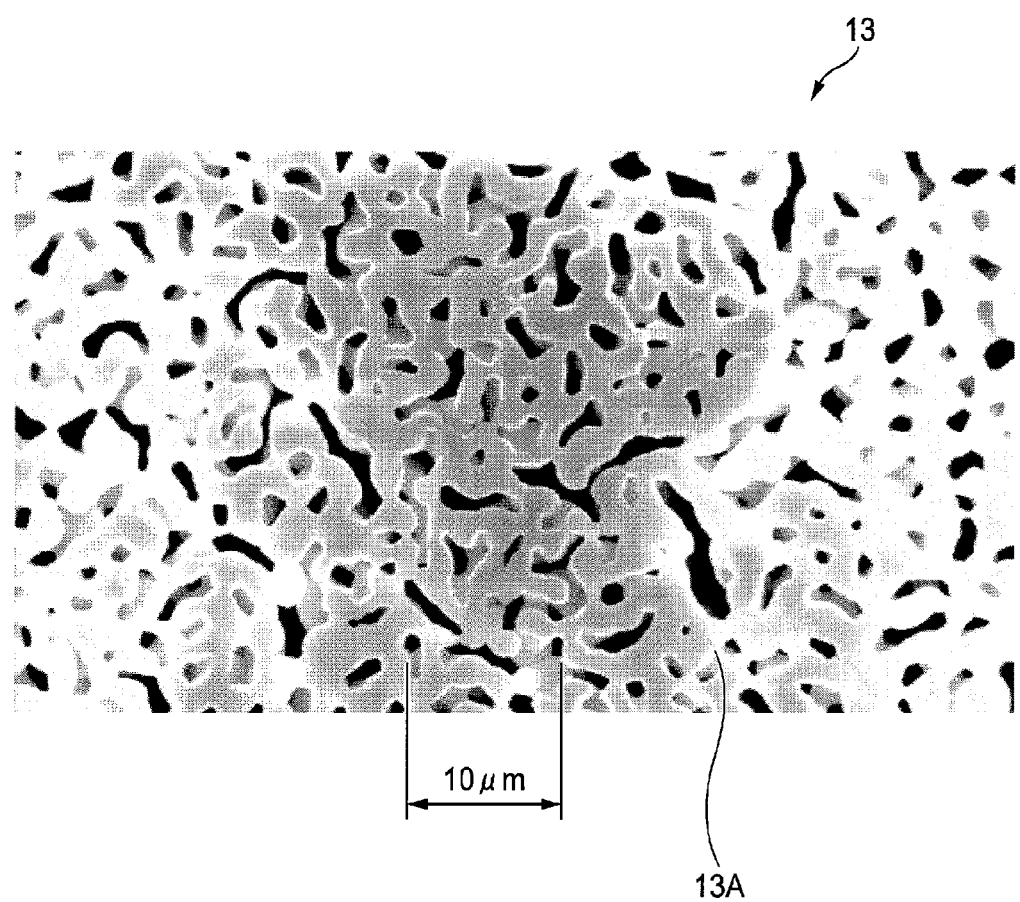
FIG. 6 is an electron microscope photograph (an SEM image) showing a cross section of a non-columnar crystal of the scintillator.

FIG. 6 is an electron microscope photograph of the non-columnar portion 13 taken along cross section B-B shown in FIG. 4 (a cross section of a base end side of the non-columnar portion 13 taken in its thicknesswise direction). In the non-columnar portion 13, the non-columnar crystals 13A that are smaller than the columnar crystals 12A shown in FIG. 5 in terms of a diameter irregularly join and overlap each other. Very few definite voids among the crystals are observed. The voids shown in FIG. 6 are smaller in number than those shown in FIG. 5. Observation results shown in FIGS. 5 and 6 clearly show that the porosity of the non-columnar portion 13 is lower than the porosity of the columnar portion 12.

The porosity of the non-columnar portion 13 is calculated from a deposition area of the non-columnar portion 13 on the support 11, the thickness of the non-columnar portion 13, CsI density, and an actually measured weight of the scintillator panel. The thus-calculated porosity of the non-columnar portion 13 achieved in its entirety along its thicknesswise direction is 10% or less.

The non-columnar portion 13 is an area formed over the support 11 in an initial phase of deposition. The porosity of an area of the non-columnar portion 13 contacting the surface of the support 11 is zero or nearly zero. The base end of the non-columnar portion 13 remains in close contact, along an entire contact plane, with the support 11.

The thickness of the non-columnar portion 13 is smaller than the thickness of the columnar portion 12 and preferably ranges from 5 micrometers to 125 micrometers. Specifically, in order to assure adhesion to the support 11, the thickness of the non-columnar portion 13 should preferably be 5 micrometers or more. If the thickness of the non-columnar portion 13 that does not exhibit any light guide effect is too large, light crosses each other among pixels in the non-columnar portion 13, whereupon an image becomes likely to become blurred. For this reason, it is preferable that the thickness of the non-columnar portion 13 be less than 125 micrometers.

Moreover, a sufficient thickness of the non-columnar portion 13 is a minimum value at which adhesion to the support 11 and a light reflection capability are accomplished.

Depending on manufacturing conditions, or the like, the non-columnar portion 13 may also be configured into a plurality of stacked layers rather than into a single layer. In such a case, the thickness of the non-columnar portion 13 refers to a distance from the surface of the support 11 to the topmost surface of the non-columnar portion 13.

In relation to measurement of a crystal diameter achieved when the crystals remain adhered to each other, as in the case of the non-columnar portion 13, a line interconnecting indentations (recesses) existing between the adjoining non-columnar crystals 13A is taken as a grain boundary. The crystals remaining adhered to each other are separated from each other in such a way that the minimum polygon is formed, and the diameters of the crystals are measured. As in the case of the diameters of the columnar crystals 12A of the columnar portion 12, an average of the measured crystal diameters is determined, and the average is adopted.

From the viewpoint of an efficient reflection property and adhesion to the support 11, a preferable diameter of the non-columnar crystals 13A of the non-columnar portion 13 ranges from 0.5 micrometers to 7.0 micrometers. The diameter of the non-columnar crystals 13A is smaller than the diameter of the columnar crystals 12A.

Since the substantially spherical shape of the crystals is easily maintained, a smaller diameter is preferable for the non-columnar crystals 13A. However, if the diameter of the non-columnar crystals 13A is too small, the porosity will come close to zero, and the non-columnar portion 13 will not play the role of the light reflection layer. For this reason, a preferable diameter of the non-columnar crystals 13A is 0.5 micrometers or more. On the contrary, if the diameter of the non-columnar crystals 13A is too large, flatness and a surface area of the non-columnar portion 13 will decrease, which in turn may cause a decline of adhesion to the support 11. Further, the crystals will join each other to thereby decrease porosity and deteriorate a reflection effect. For these reasons, a preferable crystal diameter for the non-columnar portion 13 is 7.0 micrometers or less.

As a result of such a non-columnar portion 13 being formed, the columnar crystals 12A can be caused to grow in a superior crystalline state while taking the non-columnar portion 13 as a base. The diameter, thickness, and porosity of the non-columnar crystals 13A are determined in consideration of a light reflection characteristic and adhesion to the support 11.

Since adhesion between the support 11 and the scintillator 10 is enhanced by provision of the non-columnar portion 13, the scintillator 10 will become less likely to fall from the support 11 even when heat emitted from the control module 70 propagates to the scintillator 10.

For instance, an organic photoelectric conversion (OPC) material, an organic TFT, a TFT using an amorphous oxide (e.g., a-IGZO), and a flexible material (aramid, and a bio-nanofiber), or the like, can be used for the photodetecting unit 50 (including the protective member 49), the support 11, and others. These device-related materials will be described later.

4. Method of Manufacturing X-Ray Image Detection Apparatus and X-Ray Imaging Cassette By reference to FIGS. 7 through 10, explanations are now given to an example method of manufacturing the X-ray image detection apparatus 1 having the above respective configurations.

A layered product 55, such as that shown in FIG. 7, is used at the time of manufacture of the X-ray image detection apparatus 1. During manufacture of the layered product 55, the protective member 49 is layered on the substrate 51, such as alkalifree glass, by way of a peel layer 52 formed from a dissolve adhesive, or the like. The PDs 41 and the TFTs 42 (FIG. 2), which are to make up the thin film portion 40, are fabricated on the protective member 49 by use of processes, like photolithography, etching, and others (a photodetecting unit production process). The thus-manufactured layered product 55 includes the substrate 51, the peel layer 52, the protective member 49, and the thin film portion 40.

Since the substrate 51 is peeled off in a subsequent process and will not finally make up the photodetecting unit 50, an X-ray absorption characteristic of the substrate 51 does not need to be taken into account. It is desirable to employ the substrate 51 having a thickness sufficient for assuring ease of handling and peeling in subsequent processes.

The dissolve adhesive has advantages in enabling firm bonding and facilitating easy dissolution of bonded objects. When the substrate 51 is a translucent member, like glass, a dissolve adhesive that can be dissolved upon exposure to light, such as UV radiation, can preferably be used.

Figure 8:
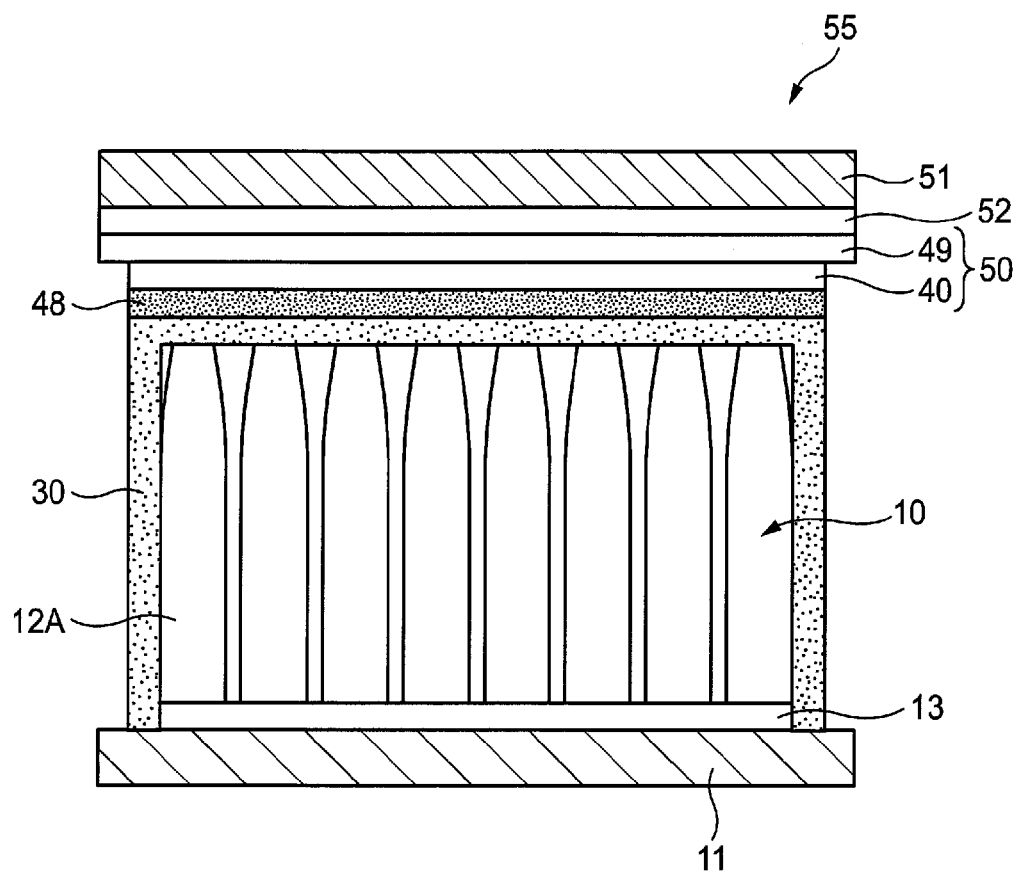
FIG. 8 is a side cross sectional view schematically showing that the photodetecting unit shown in FIG. 7 and the scintillator deposited on a support are integrated together.

As shown in FIG. 8, the scintillator 10 that is formed on the support 11 and covered with the protective film 30 is bonded to the layered product 55 by way of the adhesive layer 48, thereby bringing the scintillator 10 and the thin film portion 40 into a uniform, close contact with each other in an integrated fashion (an integration process).

No particular limitations are imposed on the method of closely bonding the scintillator 10 and the thin film portion 40 to each other, and the minimum requirement for bonding is that the scintillator 10 and the thin film portion 40 be optically coupled together. There can be adopted, as a technique for bringing both the scintillator 10 and the thin film portion 40 into close contact with each other, either a technique for bringing both of them into close contact with each other while they remain directly facing each other or a technique for bringing both of them into close contact with each other while a resin layer is sandwiched therebetween.

Figure 9:
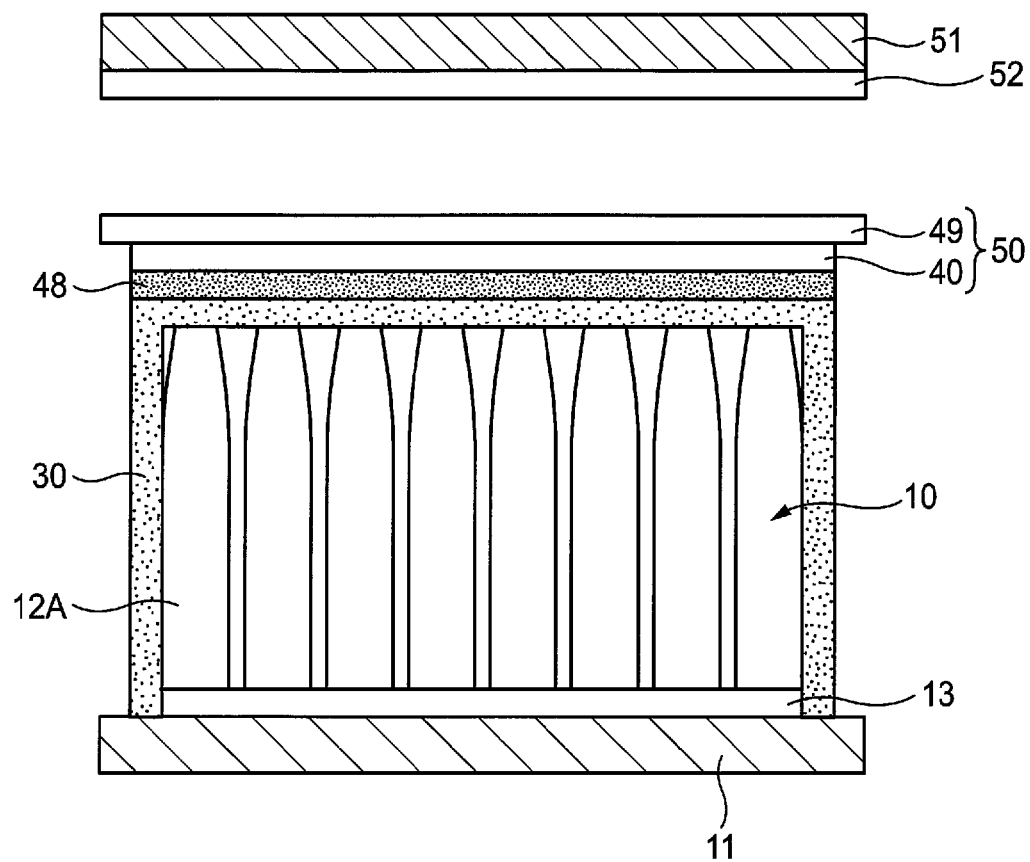
FIG. 9 is a side cross sectional view showing a process of peeling the substrate off from the photodetecting unit.

As shown in FIG. 9, the layered product 55 (FIG. 7) is subsequently dissolved. To be more specific, the substrate 51 and the protective member 49 are separated from each other by means of peeling, and the substrate 51 and the peel layer 52 are removed (a substrate peel-removal process). Since the scintillator 10 and the support 11 support the thin film portion 40 at this time, ease of handling of the thin film portion 40 achieved at the time of peeling of the substrate 51 is superior. When appropriate handling means can hold the thin film portion 40, processing pertaining to the substrate peel-and-removal process may first be performed prior to processing pertaining to the scintillator and photodetecting unit integration process.

The X-ray image detection apparatus 1 having the photodetecting unit 50 not including the substrate 51 is manufactured through the foregoing operations.

Figure 10:
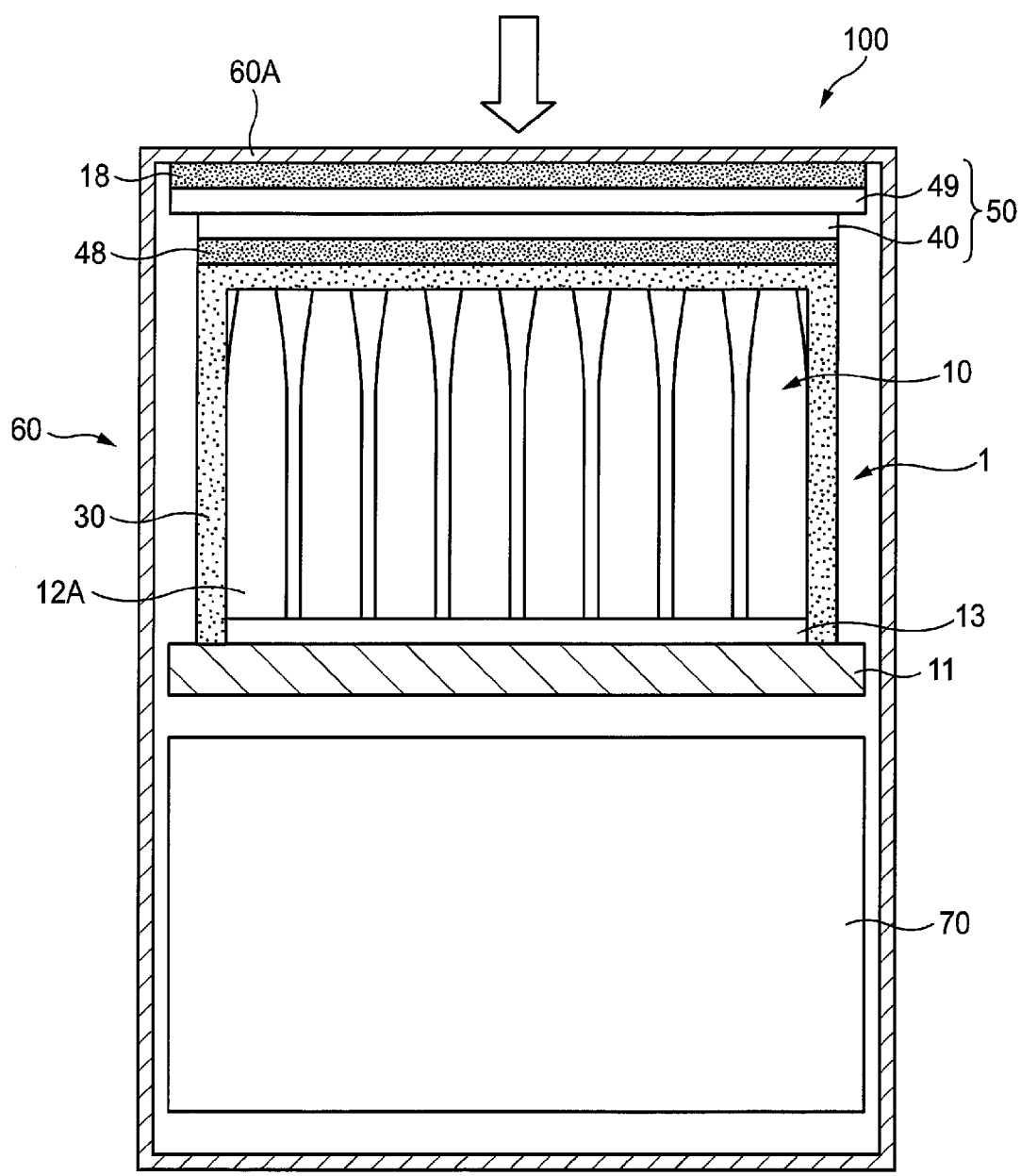
FIG. 10 is a side cross sectional view schematically showing an X-ray image detection apparatus accommodated in a cassette housing.

As shown in FIG. 10, the X-ray image detection apparatus 1 is accommodated into the housing 60 on the occasion of manufacture of the X-ray imaging cassette 100. To be more precise, the X-ray image detection apparatus 1 is housed in the housing 60 in such a way that the thin film portion 40 opposes the back side of the top plate 60A by way of the protective member 49. It is preferable that the photodetecting unit 50 be bonded, by way of its protective member 49, to the top plate 60A. On the occasion of bonding operation, it is preferable to bring the protective member 49 and the top plate 60A into close contact with each other in their entirety by way of the adhesive layer 18; however, they may also be partially bonded together. The top plate 60A and the X-ray image detection apparatus 1 receive load of the subject supported by the top plate 60A. The withstand load of the X-ray imaging cassette 100 can be increased by means of integrally stacking the top plate 60A and the X-ray image detection apparatus 1 one on top of the other as mentioned above.

The X-ray imaging cassette 100 is manufactured as mentioned above.

5. Working Effects Yielded by Protective Member Accommodated in Photodetecting Unit The X-ray image detection apparatus 1 and the X-ray imaging cassette 100 that have been described thus far yield the following working effects.

The protective member 49 is accommodated in the photodetecting unit 50, and the thin film portion 40 is protected by the protective member 49 after peeling of the substrate 51 (FIG. 9). The thin film portion 40 can be protected from a water content of the outside air, or the like, by means of the protective member 49 provided as mentioned above. Further, it also becomes possible to reinforce the thin film portion 40 against load from the outside, or the like. Specifically, since a problem, which would otherwise arise as a result of the substrate 51 being peeled off from the layered product 55 of the photodetecting unit, is solved, a picture quality enhancing effect yielded by the configuration in which the scintillator is exposed to X-ray applied from the direction of the photodetecting unit can be sufficiently exerted. Al equivalent weight of the protective member 49 is under 1.8 mm Since X-ray absorbed by the X-ray entrance side of the scintillator 10 can be reduced to a minimal level by use of such a protective member 49 exhibiting low X-ray absorbency, enhancement of image quality of a detected image owing to an increase in the quantity of X-ray entering the scintillator 10 can be accomplished. Moreover, since the protective member 49 is interposed between the substrate 51 and the thin film portion 40 during manufacturing operation, deterioration of performance of the thin film portion 40, which would otherwise be caused by influence (sodium contamination, or the like) of the substrate 51 during production of the thin film portion 40, can be prevented. Moreover, since the substrate 51 is easier to peel when compared with a case where a thin film portion formed directly on a substrate is peeled off from the substrate, it becomes possible to peel the substrate 51 without damage being inflicted on the thin film portion 40 and the scintillator 10 remaining in close contact with the thin film portion 40. It is possible to achieve both a reduction in the quantity of X-ray absorbed by the photodetecting unit and maintenance of strength required for the photodetecting unit, by means of appropriately determining the thickness of the protective member 49 as required.

From the above, enhancement of picture quality can further be promoted by means of the configuration in which X-ray enters the scintillator 10 by way of the photodetecting unit 50.

In the X-ray imaging cassette 100, the photodetecting unit 50 of the X-ray image detection apparatus 1 is bonded to the back side of the top plate 60A of the cassette. Hence, a distance between the subject put on the top plate 60A and the photodetecting unit 50 becomes shorter, which in turn results in enhancement of sensitivity and MTF. In addition, the substrate 51 is peeled, whereby the photodetecting unit 50 is made slim. Therefore, further enhancement of picture quality can be attempted. In other words, the effect resulting from presence of the protective member 49 and peeling of the substrate 51 becomes more outstanding under the configuration in which the scintillator 10 is exposed to X-ray applied from the direction of the photodetecting unit 50 and where the photodetecting unit 50 is bonded to the top plate 60A.

6. Example Modification

The configuration of the protective member provided in the photodetecting unit is not limited to that mentioned above. As shown in; for instance, FIG. 11, there can also be adopted a configuration including a base substance 49A (a resin layer) made of a resin and a light reflection film 49B (a light reflection layer) that is layered on an X-ray entrance side of the base substance 49A and that is made of aluminum or the like.

Figure 12:
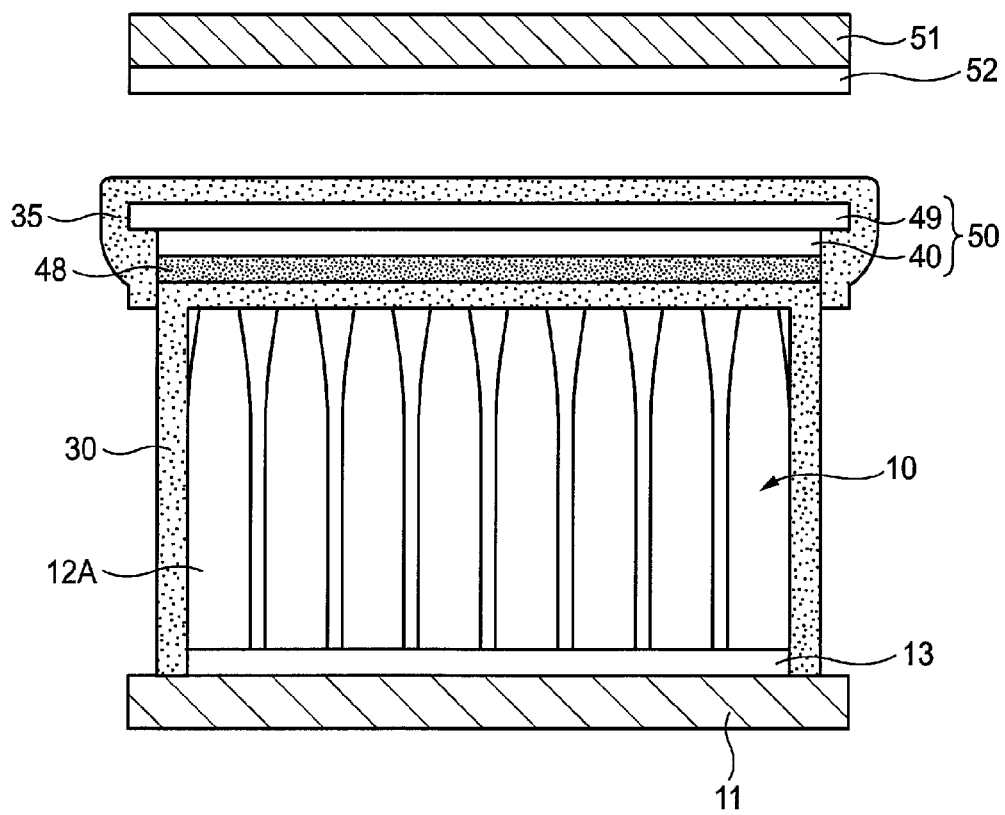

FIG. 12 shows an example modification of the X-ray image detection apparatus. In the example modification, after the process for peeling and removing a substrate, a protective film 35 is provided by use of; for instance, parylene, on side surfaces of the thin film portion 40, side surfaces of the protective member 49, and the peel surface of the protective member 49 facing the substrate 51. In addition to the protective film 30 provided on the scintillator 10, the thus-provided protective film 35 seals the scintillator 10 and the thin film portion 40 without fail. Accordingly, deterioration of performance of the scintillator 10 and the thin film portion 40 can sufficiently be prevented.

Figure 13:
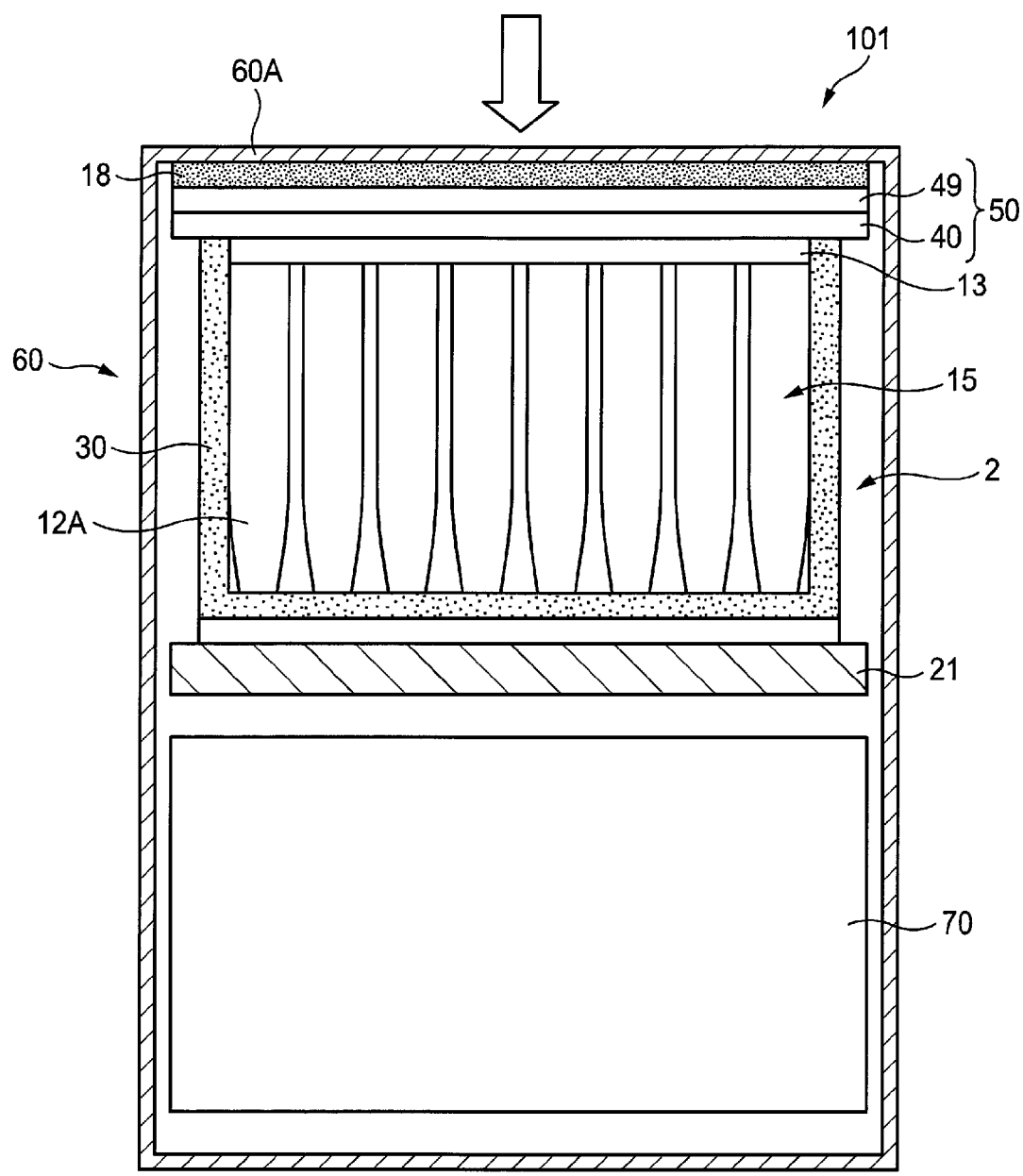
FIG. 13 is a side cross sectional view schematically showing a general configuration of an X-ray imaging cassette differing from that shown in FIG. 1.

FIG. 13 shows an X-ray imaging cassette 101. The X-ray imaging cassette 101 has an X-ray image detection apparatus 2 and the housing 60. In the X-ray image detection apparatus 1 shown in FIG. 1, the scintillator 10 and the photodetecting unit 50 are bonded together by way of the adhesive layer 48. In the X-ray image detection apparatus 2 shown in FIG. 13, a scintillator 15 is deposited on the photodetecting unit 50. Except this point, the X-ray image detection apparatus 2 is configured in the same manner as is the X-ray image detection apparatus 1. Even when the X-ray image detection apparatus 2 is manufactured, the layered product 55, such as that shown in FIG. 7, is used. Before dissolution of the layered product 55, the scintillator 15 is deposited on the photodetecting unit 50 (the photodetecting unit production process). Subsequently, the substrate 51 is peeled off (the substrate peel-removal process). However, it is preferable to peel the substrate 51 off from a protective member 49 after a support member 21 has been put on a leading end of the columnar crystals 12A of the scintillator 15 before peeling of the substrate (an integration process). This makes it possible to prevent the columnar crystals 12A from being susceptible to damage, which would otherwise be caused when crystals contact each other, during peeling operation. The support member 21 is preferably a light reflection member, such as aluminum.

To be more specific, the X-ray image detection apparatus 2 is produced through a photodetecting unit production process for layering the protective member 49 on the substrate 51, to thus form the thin film portion 40 on the protective member 49 and consequently fabricate the photodetecting unit 50; a scintillator production process for forming the scintillator 15 on the thin film portion 40 of the photodetecting unit 50 and placing the support member 21 on the other side of the scintillator 15 with respect to its side facing the thin film portion 40; and a substrate peel-removal process for peeling and removing the substrate 51 from the protective member 49 integrated with the scintillator 15 in the scintillator production process.

The scintillators 10 and 15 of the X-ray image detection apparatus 1 and 2 may not be provided with the non-columnar portion 13 including the non-columnar crystals 13A, such as those mentioned above. However, if the non-columnar portion 13 is formed, the following effect will be yielded. Namely, the non-columnar portion can be formed at an arbitrary position on the scintillator along the direction of crystal growth.

When a non-columnar portion is formed at a base end or leading end of the scintillator along its direction of crystal growth, it is possible to assure adhesion between a support and a photodetecting unit that will be integrated with the scintillator after formation of the scintillator or adhesion between the support on which the scintillator is deposited and the thin film portion. Assuring adhesion makes it possible to prevent removal of the scintillator from the support and the photodetecting unit and also deterioration of performance of the scintillator, which would otherwise be caused by absorption of moisture. Further, when a non-columnar portion is formed at the leading end of the columnar crystals 12A, the surface of the scintillator is planarized by means of the non-columnar portion. Accordingly, the scintillator and the photodetecting unit can uniformly be bonded together. Quality of a detected image can thereby be enhanced. When the non-columnar portion is formed at the base end (i.e., an initially deposited area) of the scintillator, the columnar crystals 12A can be caused to grow with superior crystalline on the basis of the non-columnar portion.

The strength of the scintillator can be enhanced by means of providing the columnar portion with the non-columnar portion. Impact resistance of the scintillator can thereby be enhanced. Further, it is possible to assure strength against load which will be imposed on the scintillator when the scintillator and the support or the photodetecting unit are bonded together. Hence, the scintillator and the photodetecting unit, or the like, can be firmly pressed against each other and uniformly brought into close contact with each other. Moreover, it is possible to increase withstand load of a cassette formed by bonding the panel, which is formed by inclusion of the scintillator, to the top plate of the housing as a result of enhancement of strength of the scintillator. On this occasion, since the substrate has already been peeled off from the photodetecting unit, the top plate and the respective photodetecting units come further closer to each other. Hence, an effect of enhancing sensitivity and image quality can be further increased. As a result of the non-columnar portion being formed at the leading end of the columnar portion, inflow of a material of the protective film into gaps among the columnar crystals can be prevented. Hence, an effect of preventing deterioration of MTF is also yielded.

Figure 14:
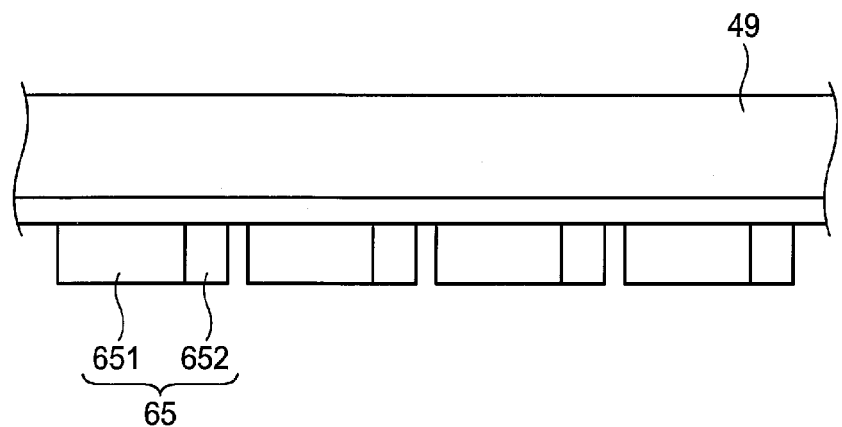
FIG. 14 is a schematic view showing an example modification of a thin film portion of the photodetecting unit.

FIG. 14 shows another thin film portion 65 that can be replaced with the thin film portion 40 shown in FIG. 2. PDs 651 and TFTs 652 belonging to the thin film portion 65 are arranged within the same plane or the substantially same plane. As a result of the PDs 651 and the TFTs 652 being arranged side by side within a plane as mentioned above, the thin film portion 65 can be made much thinner.

A TFT fabricated of an amorphous oxide semiconductor (a-IGZO) can be used for both the thin film portion 40 shown in FIG. 2 and the thin film portion 65 shown in FIG. 14. Sensitivity of a-IGZO is a wavelength of 350 nm or more, and sensitivity is hardly achieved in a visible light range. Therefore, switching noise does not occur in the TFTs. A necessity for providing the TFTs with a light reflection layer can be obviated.

Figure 15:
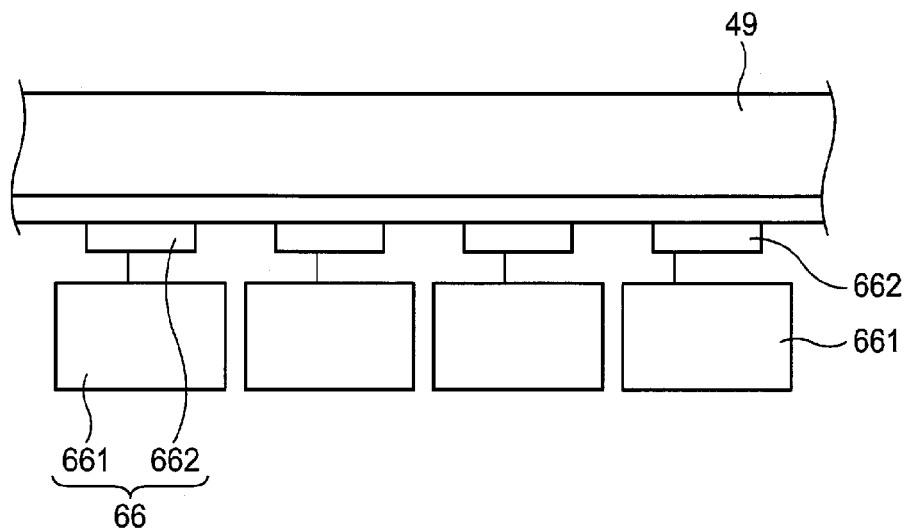
FIG. 15 is a schematic view showing another example modification of the thin film portion of the photodetecting unit.

An organic material can also be used for the PDs and the TFTs. FIG. 15 shows photoelectric conversion elements 661 having a photoconductive layer formed from an OPC (organic photoelectric conversion material) and TFTs 662 formed from an organic material. A thin film portion 66 including the photoelectric conversion elements 661 and the TFTs 662 can also be replaced with the thin film portion 40 shown in FIG. 2.

The organic material used for the photoelectric conversion elements 661 and the TFTs 662 hardly absorbs X-ray. Hence, the quantity of X-ray that reach the scintillator 10 after having passed through the photoelectric conversion elements 661 and the TFTs 662 can be increased. When CsI:Tl that emits green light is used for the scintillator and when the transparent organic material of the TFTs is a phthalocyanine compound expressed by the chemical formula 1 described in; for instance, JP-A-2009-212389 or a naphthalocyanine compound expressed by the chemical formula 2 descried in the same, sensitivity is not exhibited in a luminous wavelength range. Therefore, switching noise does not occur in the TFTs. In this case, the OPC of the photoelectric conversion elements 661 is preferably quinacridone.

The photoelectric conversion elements 661 and the TFTs 662 formed from the organic material may also be placed on the same plane or substantially the same plane, as shown in FIG. 14.

The photoelectric conversion element, like a PD, and the TFTs formed from an amorphous oxide or an organic material, such as those mentioned above, can be caused to grow at a temperature that is lower than the temperature used for forming a-Si. Therefore, a room for choice of a material of the protective member 49 becomes broader, and a protective member made of a resin also becomes usable.

7. Available Device Material

[7-1. OPC (Organic Photoelectric Conversion) Material]

For example, any OPC (Organic Photoelectric Conversion) material disclosed in JP-A-2009-32854 can be used for the aforementioned PDs 41 (FIG. 2) or the like. A film formed out of the OPC material (hereinafter referred to as OPC film) can be used as the photoconductive layer of the PDs 41. The OPC film contains an organic photoelectric conversion material, which absorbs light emitted from the scintillator and generates electric charges corresponding to the absorbed light. Thus, the OPC film containing the organic photoelectric conversion material has a sharp absorption spectrum in a visible light range. Electromagnetic waves other than the light emitted by the scintillator are hardly absorbed by the OPC film. Thus, noise generated by radioactive rays such as X-rays absorbed by the OPC film can be suppressed effectively.

It is preferable that the absorption peak wavelength of the organic photoelectric conversion material forming the OPC film is closer to the peak wavelength of light emitted by the scintillator in order to more efficiently absorb the light emitted by the scintillator. Ideally, the absorption peak wavelength of the organic photoelectric conversion material agrees with the peak wavelength of the light emitted by the scintillator. However, if the difference between the absorption peak wavelength of the organic photoelectric conversion material and the peak wavelength of the light emitted by the scintillator is small, the light emitted by the scintillator can be absorbed satisfactorily. Specifically, the difference between the absorption peak wavelength of the organic photoelectric conversion material and the peak wavelength of the light emitted by the scintillator in response to radioactive rays is preferably not larger than 10 nm, more preferably not larger than 5 nm.

Examples of the organic photoelectric conversion material that can satisfy such conditions include arylidene-based organic compounds, quinacridone-based organic compounds, and phthalocyanine-based organic compounds. For example, the absorption peak wavelength of quinacridone in a visible light range is 560 nm. Therefore, when quinacridone is used as the organic photoelectric conversion material and CsI(Tl) is used as the fluorescent material of the scintillator, the aforementioned difference in peak wavelength can be set within 5 nm so that the amount of electric charges generated in the OPC film can be increased substantially to the maximum.

At least a part of an organic layer provided between the bias electrode and the charge collection electrode of PD 41 can be formed out of an OPC film. More specifically, the organic layer can be formed out of a stack or a mixture of a portion for absorbing electromagnetic waves, a photoelectric conversion portion, an electron transport portion, an electron hole transport portion, an electron blocking portion, an electron hole blocking portion, a crystallization prevention portion, electrodes, interlayer contact improvement portions, etc.

Preferably the organic layer contains an organic p-type compound or an organic n-type compound. An organic p-type semiconductor (compound) is a donor-type organic semiconductor (compound) as chiefly represented by an electron hole transport organic compound, meaning an organic compound having characteristic to easily donate electrons. More in detail, of two organic materials used in contact with each other, one with lower ionization potential is called the donor-type organic compound. Therefore, any organic compound may be used as the donor-type organic compound as long as the organic compound having characteristic to donate electrons. Examples of the donor-type organic compound that can be used include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic compound (naphthalene derivative, anthracene derivative, phenanthrene derivative, tetracene derivative, pyrene derivative, perylene derivative, fluoranthene derivative), a metal complex having a nitrogen-containing heterocyclic compound as a ligand, etc. The donor-type organic semiconductor is not limited thereto but any organic compound having lower ionization potential than the organic compound used as an n-type (acceptor-type) compound may be used as the donor-type organic semiconductor.

The n-type organic semiconductor (compound) is an acceptor-type organic semiconductor (compound) as chiefly represented by an electron transport organic compound, meaning an organic compound having characteristic to easily accept electrons. More specifically, when two organic compounds are used in contact with each other, one of the two organic compounds with higher electron affinity is the acceptor-type organic compound. Therefore, any organic compound may be used as the acceptor-type organic compound as long as the organic compound having characteristic to accept electrons. Examples thereof include a fused aromatic carbocyclic compound (naphthalene derivative, anthracene derivative, phenanthrene derivative, tetracene derivative, pyrene derivative, perylene derivative, fluoranthene derivative), a 5- to 7-membered heterocyclic compound containing a nitrogen atom, an oxygen atom or a sulfur atom (e.g. pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, tribenzazepine etc.), a polyarylene compound, a fluorene compound, a cyclopentadiene compound, a silyl compound, and a metal complex having a nitrogen-containing heterocyclic compound as a ligand. The acceptor-type organic semiconductor is not limited thereto. Any organic compound may be used as the acceptor-type organic semiconductor as long as the organic compound has higher electron affinity than the organic compound used as the donor-type organic compound.

As for p-type organic dye or n-type organic dye, any known dye may be used. Preferred examples thereof include cyanine dyes, styryl dyes, hemicyanine dyes, merocyanine dyes (including zero-methine merocyanine (simple merocyanine)), trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, and fused aromatic carbocyclic dyes (naphthalene derivative, anthracene derivative, phenanthrene derivative, tetracene derivative, pyrene derivative, perylene derivative, fluoranthene derivative).

A photoelectric conversion film (photosensitive layer) which has a layer of a p-type semiconductor and a layer of an n-type semiconductor between a pair of electrodes and at least one of the p-type semiconductor and the n-type semiconductor is an organic semiconductor and in which a bulk heterojunction structure layer including the p-type semiconductor and the n-type semiconductor is provided as an intermediate layer between those semiconductor layers may be used preferably. The bulk heterojunction structure layer included in the photoelectric conversion film can cover the defect that the carrier diffusion length of the organic layer is short. Thus, the photoelectric conversion efficiency can be improved. The bulk heterojunction structure has been described in detail in JP-A-2005-303266.

It is preferable that the photoelectric conversion film is thicker in view of absorption of light from the scintillator. The photoelectric conversion film is preferably not thinner than 30 nm and not thicker than 300 nm, more preferably not thinner than 50 nm and not thicker than 250 nm, particularly more preferably not thinner than 80 nm and not thicker than 200 nm in consideration of the ratio which does make any contribution to separation of electric charges.

As for any other configuration about the aforementioned OPC film, for example, refer to description in JP-A-2009-32854.

[7-2. Organic TFT (Thin Film Transistor)]

Although inorganic materials are often used for the aforementioned TFTs 42 or the like, organic materials may be used, for example, as disclosed in JP-A-2009-212389. Organic TFT may have any type of structure but a field effect transistor (FET) structure is the most preferable. In the FET structure, a substrate is disposed in the bottom layer, and a gate electrode is provided partially an upper surface of the substrate. An insulator layer is provided to cover the electrode and touch the substrate in the other portion than the electrode. Further, a semiconductor active layer is provided on an upper surface of the insulator layer, and a source electrode and a drain electrode are disposed partially on the upper surface of the semiconductor active layer and at a distance from each other. This configuration is called a top contact type device. A bottom contact type device in which a source electrode and a drain electrode are disposed under a semiconductor active layer may be also used preferably. In addition, a vertical transistor structure in which a carrier flows in the thickness direction of an organic semiconductor film may be used.

(Semiconductor Active Layer)

A p-type organic semiconductor material is used as the material of the semiconductor active layer. The p-type organic semiconductor material is substantially colorless and transparent. For example, the thickness of the organic semiconductor thin film may be measured by a stylus thickness meter. A plurality of thin films with different thicknesses may be manufactured and their absorption spectra may be measured so that the maximum absorbance per film thickness of 30 nm can be obtained by conversion based on a calibration curve.

Organic semiconductor materials mentioned herein are organic materials showing properties as semiconductors. Examples of the organic semiconductor materials include p-type organic semiconductor materials (or referred to as p-type materials simply or as electron hole transport materials) which conduct electron holes (holes) as carriers, and n-type organic semiconductor materials (or referred to as n-type materials simply or as electrode transport materials) which conduct electrons as carriers, similarly to a semiconductor formed out of an inorganic material. Of the organic semiconductor materials, lots of p-type materials generally show good properties. In addition, p-type transistors are generally excellent in operating stability as transistors under the atmosphere. Here, description here will be made on a p-type organic semiconductor material.

One of properties of organic thin film transistors is a carrier mobility (also referred to as mobility simply) μ which indicates the mobility of a carrier in an organic semiconductor layer. Although preferred mobility varies in accordance with applications, higher mobility is generally preferred. The mobility is preferably not lower than $1.0*10^{-7}$ cm$^2$/Vs, more preferably not lower than $1.0*10^{-6}$ cm$^2$/Vs, further preferably not lower than $1.0*10^{-5}$ cm$^2$/Vs. The mobility can be obtained by properties or TOF (Time Of Flight) measurement when the field effect transistor (FET) device is manufactured.

The p-type organic semiconductor material may be either a low molecular weight material or a high molecular weight material, but preferably a low molecular weight material. Lots of low molecular weight materials typically show excellent properties due to easiness in high purification because various refining processes such as sublimation refining, recrystallization, column chromatography, etc. can be applied thereto, or due to easiness in formation of a highly ordered crystal structure because the low molecular weight materials have a fixed molecular structure. The molecular weight of the low molecular weight material is preferably not lower than 100 and not higher than 5,000, more preferably not lower than 150 and not higher than 3,000, further more preferably not lower than 200 and not higher than 2,000.

Preferred specific examples of such a p-type organic semiconductor material will be shown. Bu represents a butyl group, Pr represents a propyl group, Et represents an ethyl group, and Ph represents a phenyl group.

[Chemical 1]

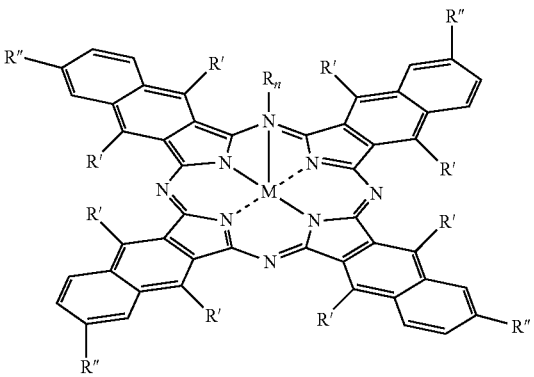

-continued

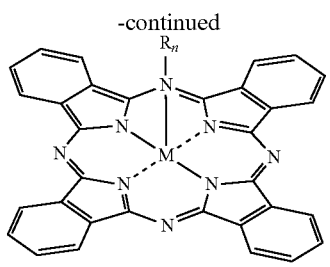

Compound 1 to 15    Compound 16 to 20

| Compound | M    | R              | n | R'     | R"   |
|----------|------|----------------|---|--------|------|
| 1        | Si   | OSi(n-Bu)$_3$  | 2 | H      | H    |
| 2        | Si   | OSi(i-Pr)$_3$  | 2 | H      | H    |
| 3        | Si   | OSi(OEt)$_3$   | 2 | H      | H    |
| 4        | Si   | OSiPh$_3$      | 2 | H      | H    |
| 5        | Si   | O(n-C$_8$H$_{17}$) | 2 | H  | H    |
| 7        | Ge   | OSi(n-Bu)$_3$  | 2 | H      | H    |
| 8        | Sn   | OSi(n-Bu)$_3$  | 2 | H      | H    |
| 9        | Al   | OSi(n-C$_6$H$_{13}$)$_3$ | 1 | H | H  |
| 10       | Ga   | OSi(n-C$_6$H$_{13}$)$_3$ | 1 | H | H  |
| 11       | Cu   | —              | — | O(n-Bu)| H    |
| 12       | Ni   | —              | — | O(n-Bu)| H    |
| 13       | Zn   | —              | — | H      | t-Bu |
| 14       | V=O  | —              | — | H      | t-Bu |
| 15       | H$_2$| —              | — | H      | t-Bu |
| 16       | Si   | OSiEt$_3$      | 2 | —      | —    |
| 17       | Ge   | OSiEt$_3$      | 2 | —      | —    |
| 18       | Sn   | OSiEt$_3$      | 2 | —      | —    |
| 19       | Al   | OSiEt$_3$      | 1 | —      | —    |
| 20       | Ga   | OSiEt$_3$      | 1 | —      | —    |

(Device Constituent Materials other than Semiconductor Active Layer)

Description will be made below on device constituent materials other than the semiconductor active layer in the organic thin film transistor. The visible-light or infrared-light transmittance of each of those materials is preferably not lower than 60%, more preferably not lower than 70%, further more preferably not lower than 80%.

The substrate is not limited particularly as long as it has required smoothness. Examples of the substrate include glass, quartz, light transmissive plastic film, etc. Examples of the light transmissive plastic film include films or the like, made from polyethylene terephthalate (PET), polyethylene naphthalate (PEN), polyether sulfone (PES), polyether imide, polyetheretherketone, polyphenylene sulfide, polyalylate, polyimide, polycarbonate (PC), cellulose triacetate (TAC), cellulose acetate propionate (CAP), etc. In addition, any organic or inorganic filler may be contained in these plastic films. A flexible substrate formed out of aramid, bionanofiber, or the like may be used preferably as the substrate.

The material forming the gate electrode, the source electrode or the drain electrode is not limited especially if it has required electric conductivity. Examples thereof include electrically conductive oxides such as ITO (indium-doped tin oxide), IZO (indium-doped zinc oxide), SnO$_2$, ATO (antimony-doped tin oxide), ZnO, AZO (aluminum-doped zinc oxide), GZO (gallium-doped zinc oxide), TiO$_2$, FTO (fluorine-doped tin oxide), etc., electrically conductive polymers such as PEDOT/PSS (poly(3,4-ethylenedioxythiophene)/polystyrenesulfonate), carbon materials such as carbon nanotube, etc. These electrode materials may be formed into films, for example, by a method such as a vacuum deposition method, sputtering, a solution application method, etc.

The material used for the insulating layer is not limited particularly as long as it has required insulating effect. Examples thereof include inorganic materials such as silicon dioxide, silicon nitride, alumina, etc., and organic materials such as polyester, (PEN (polyethylene naphthalate), PET (polyethylene terephthalate) etc.), polycarbonate, polyimide, polyamide, polyacrylate, epoxy resin, polyparaxylylene resin, novolak resin, PVA (polyvinyl alcohol), PS (polystyrene), etc. These insulating film materials may be formed into films, for example, by a method such as a vacuum deposition method, sputtering, a solution application method, etc.

As for any other configuration about the aforementioned organic TFT, for example, refer to description in JP-A-2009-212389.

[7-3. Amorphous Oxide Semiconductor]

For example, amorphous oxide disclosed in JP-A-2010-186860 may be used for the aforementioned TFTs 42. Here, description will be made on an amorphous oxide containing active layer of a FET transistor disclosed in JP-A-2010-186860. The active layer serves as a channel layer of the FET transistor where electrons or holes move.

The active layer has a configuration containing an amorphous oxide semiconductor. The amorphous oxide semiconductor can be formed into a film at a low temperature. Thus, the amorphous oxide semiconductor is formed preferably on a flexible substrate.

The amorphous oxide semiconductor used for the active layer is preferably amorphous oxide containing at least one kind of element selected from a group consisting of In, Sn, Zn and Cd, more preferably amorphous oxide containing at least one kind of element selected from a group consisting of In, Sn and Zn, further preferably amorphous oxide containing at least one kind of element selected from a group consisting of In and Zn.

Specific examples of the amorphous oxide used for the active layer include In$_2$O$_3$, ZnO, SnO$_2$, CdO, Indium-Zinc-Oxide (IZO), Indium-Tin-Oxide (ITO), Gallium-Zinc-Oxide (GZO), Indium-Gallium-Oxide (IGO), and Indium-Gallium-Zinc-Oxide (IGZO).

It is preferable that a vapor phase film formation method targeting at a polycrystal sinter of the oxide semiconductor is used as a method of forming the active layer. Of vapor phase film formation methods, a sputtering method or a pulse laser deposition (PLD) method is preferred. Further, the sputtering method is preferred in view from mass productivity. For example, the active layer is formed by an RF magnetron sputtering deposition method with a controlled degree of vacuum and a controlled flow rate of oxygen.

The thus formed active layer is confirmed to be an amorphous film by a well-known X-ray diffraction method. The composition ratio of the active layer is obtained by an RBS (Rutherford Backscattering Spectrometry) method.

In addition, the electric conductivity of the active layer is preferably lower than $10^2$ Scm$^{-1}$ and not lower than $10^{-4}$ Scm$^{-1}$, more preferably lower than $10^2$ Scm$^{-1}$ and not lower than $10^{-1}$ Scm$^{-1}$. Examples of the method of adjusting the electric conductivity of the active layer include a known adjusting method using oxygen defect, an adjusting method using a composition ratio, an adjusting method using impurities, and an adjusting method using an oxide semiconductor material.

As for any other configuration about the aforementioned amorphous oxide, for example, refer to description in JP-A-2010-186860.

[7-4. Flexible Material]

It may be considered that aramid, bionanofiber, etc. having properties such as flexibility, low thermal expansion and high strength, which cannot be obtained in existing glass or plastic, are used in a radiological image detection apparatus.

(1) Aramid

A film formed out of aramid which is a flexible material may be used as the insulating substrate 401 of the aforementioned support 11, the control module 70, or the like. An aramid material has high heat resistance showing a glass transition temperature of 315° C., high rigidity showing a Young's modulus of 10 GPa, and high dimensional stability showing a thermal expansion coefficient of −3 to 5 ppm/° C. Therefore, when a film made from aramid is used, it is possible to easily form a high-quality film for a semiconductor layer or a scintillator, as compared with the case where a general resin film is used. In addition, due to the high heat resistance of the aramid material, a transparent electrode material can be cured at a high temperature to have low resistance. Further, it is also possible to deal with automatic mounting with ICs, including a solder reflow step. Furthermore, since the aramid material has a thermal expansion coefficient close to that of ITO (indium tin oxide), a gas barrier film or a glass substrate, warp after manufacturing is small. In addition, cracking hardly occurs. Here, it is preferable to use a halogen-free (in conformity with the requirements of JPCA-ES01-2003) aramid material containing no halogens, in view of reduction of environmental load.

The aramid film may be laminated with a glass substrate or a PET substrate, or may be pasted onto a housing of a device.

High intermolecular cohesion (hydrogen bonding force) of aramid leads to low solubility to a solvent. When the problem of the low solubility is solved by molecular design, an aramid material easily formed into a colorless and transparent thin film can be used preferably. Due to molecular design for controlling the order of monomer units and the substituent species and position on an aromatic ring, easy formation with good solubility can be obtained with the molecular structure kept in a bar-like shape with high linearity leading to high rigidity or dimensional stability of the aramid material. Due to the molecular design, halogen-free can be also achieved.

In addition, an aramid material having an optimized characteristic in an in-plane direction of a film can be used preferably. Tensional conditions are controlled in each step of solution casting, vertical drawing and horizontal drawing in accordance with the strength of the aramid film which varies constantly during casting. Due to the control of the tensional conditions, the in-plane characteristic of the aramid film which has a bar-like molecular structure with high linearity leading to easy occurrence of anisotropic physicality can be balanced.

Specifically, in the solution casting step, the drying rate of the solvent is controlled to make the in-plane thickness-direction physicality isotropic and optimize the strength of the film including the solvent and the peel strength from a casting drum. In the vertical drawing step, the drawing conditions are controlled precisely in accordance with the film strength varying constantly during drawing and the residual amount of the solvent. In the horizontal drawing, the horizontal drawing conditions are controlled in accordance with a change in film strength varying due to heating and controlled to relax the residual stress of the film. By use of such an aramid material, the problem that the aramid film after casting may be curled.

In each of the contrivance for the easiness of casting and the contrivance for the balance of the film in-plane characteristic, the bar-like molecular structure with high linearity peculiar to aramid can be kept to keep the thermal expansion coefficient low. When the drawing conditions during film formation are changed, the thermal expansion coefficient can be reduced further.

(2) Bionanofiber

Components sufficiently small relative to the wavelength of light produce no scattering of the light. Accordingly, a flexible plastic material, or the like, reinforced by nanofibers may be used preferably in the insulating substrate, the circuit board of the control module 70, or the like. Of the nanofibers, a composite material (occasionally referred to as bionanofiber) of bacterial cellulose and transparent resin can be used preferably. The bacterial cellulose is produced by bacteria (Acetobacter Xylinum). The bacterial cellulose has a cellulose microfibril bundle width of 50 nm, which is about 1/10 as large as the wavelength of visible light. In addition, the bacterial cellulose is characterized by high strength, high elasticity and low thermal expansion.

When a bacterial cellulose substrate is impregnated with transparent resin such as acrylic resin or epoxy resin and hardened, transparent bionanofiber showing a light transmittance of about 90% in a wavelength of 500 nm while having a high fiber ratio of about 60 to 70% can be obtained. By the bionanofiber, a thermal expansion coefficient (about 3 to 7 ppm) as low as that of silicon crystal, strength (about 460 MPa) as high as that of steel, and high elasticity (about 30 GPa) can be obtained.

As for the configuration about the aforementioned bionanofiber, for example, refer to description in JP-A-2008-34556.

Any of the X-ray imaging cassettes (and the X-ray imaging cassettes) that have been described thus far can be used while built in various systems, including a medical X-ray imaging system. In particular, each of the X-ray imaging cassettes characterized by high sensitivity and high resolution can be preferably used for a mammography system that is required to detect a sharp image at a low radiation dose.

Moreover, in addition to being used as the medical X-ray imaging system, the X-ray imaging cassettes can also be used as; for instance, an industrial X-ray imaging system for non-destructive inspection. In addition, the X-ray imaging cassettes using X-ray have been described as the examples in connection with the embodiment. However, another detector for radiation other than X-ray (alpha radiation, beta radiation, gamma radiation, or the like, other than the electromagnetic waves) can also be constructed in substantially the same way as is the X-ray imaging cassette 100.

8. Disclosure of Specification

It is disclosed a method of manufacturing a radiological image detection apparatus having: a scintillator that emits fluorescence upon exposure to radiation; and a photodetecting unit disposed on a radiation entrance side of the scintillator, the method including: a photodetecting unit production process for layering on a substrate a protective member that exhibits low radiation absorbency than that exhibited by the substrate and forming a thin film portion that detects the fluorescence as an electric signal on the protective member, thereby producing the photodetecting unit; a substrate peel-removal process for peeling and eliminating the substrate from the protective member; and an integration process for integrating the previously-produced scintillator and the photodetecting unit before or after the substrate peel-removal process.

In addition, it is disclosed a method of manufacturing a radiological image detection apparatus having: a scintillator that emits fluorescence upon exposure to radiation; and a photodetecting unit disposed on a radiation entrance side of the scintillator, the method including: a photodetecting unit production process for layering on a substrate a protective member that exhibits low radiation absorbency than that exhibited by the substrate and forming a thin film portion that detects the fluorescence as an electric signal on the protective member, thereby producing the photodetecting unit; a scintillator production process for forming the scintillator on the thin film portion of the photodetecting unit and placing a support member on another side of the scintillator with respect to its side facing the thin film portion; and a substrate peel-removal process for peeling and eliminating the substrate from the protective member integrated with the scintillator in the scintillator production process.

In the method of manufacturing the radiological image detection apparatus, the protective member may be provided in such a way that an Al equivalent weight with respect to X-ray emitted at a tube voltage of 60 kV is under 1.8 mm.

In the method of manufacturing the radiological image detection apparatus, the protective member may be layered on the substrate by way of a peel layer in the photodetecting unit production process.

In addition, it is disclosed a radiological image detection apparatus including: a scintillator that emits fluorescence upon exposure to radiation; and a photodetecting unit disposed on a radiation entrance side of the scintillator, in which: the photodetecting unit includes a protective member formed from a low radiation absorbent material that exhibits low radiation absorbency than that exhibited by a glass material and a thin film portion that is formed on a side of the protective member facing the scintillator and that detects the fluorescence as an electric signal.

In the radiological image detection apparatus, an Al equivalent weight of the protective member with respect to X-ray emitted at a tube voltage of 60 kV may be under 1.8 mm.

In the radiological image detection apparatus, an Al equivalent weight of the protective member with respect to X-ray emitted at a tube voltage of 60 kV may range from 0.1 mm to 1.0 mm.

In the radiological image detection apparatus, the low radiation absorbent material may be metal (including an intermetallic compound or an alloy) and/or a resin.

In the radiological image detection apparatus, the protective member may include a resin layer and a light reflection layer that is made of metal provided on a radiation entrance side of the resin layer.

In the radiological image detection apparatus, the metal may be at least one of single metals Al, Mg, Cr, Zr, Ti, and Mn, oxides thereof, and alloys including the respective single metals.

In the radiological image detection apparatus, the resin may be at least one of polyimide, polyethylene naphthalate, polystyrene, and aramid.

In the radiological image detection apparatus, the protective member may be a light reflection member that is disposed on another side of the thin film portion with respect to its side facing the scintillator and that reflects the fluorescence toward the thin film portion.

In the radiological image detection apparatus, at least a part of the thin film portion may be formed from an amorphous oxide or an organic material.

In the radiological image detection apparatus, a thickness of the protective member may range from 0.01 mm to 1 mm.

In the radiological image detection apparatus, the scintillator may include a columnar portion formed from a group of columnar crystals resulting from columnar growth of fluorescent crystal.

In the radiological image detection apparatus, a non-columnar portion including non-columnar crystals may be provided at an end of the columnar crystals of the scintillator.

In the radiological image detection apparatus, another side of the protective member with respect to its side on which there is formed the thin film portion may correspond to a peel surface of the protective member achieved when the protective member is peeled off from the substrate that has supported the protective member.

In addition, it is disclosed a radiographic imaging cassette including: the radiological image detection apparatus; a housing that has a top plate on which a subject is to be put, in which: the housing houses the radiological image detection apparatus in such a way that the thin film portion opposes a back side of the top plate by way of the protective member.

In the radiographic imaging cassette, the protective member may be fixed to the top plate.

In the radiographic imaging cassette, Al equivalent weight achieved with respect to X-ray generated at a tube voltage of 60 kV when the protective member and the top plate are used may be under 1.8 mm.

What is claimed is:

1. A method of manufacturing a radiological image detection apparatus having: a scintillator that emits fluorescence upon exposure to radiation; and a photodetecting unit disposed on a radiation entrance side of the scintillator, the method comprising:
 a photodetecting unit production process for layering on a substrate a protective member that exhibits low radiation absorbency than that exhibited by the substrate and forming a thin film portion that detects the fluorescence as an electric signal on the protective member, thereby producing the photodetecting unit;
 a substrate peel-removal process for peeling and eliminating the substrate from the protective member; and
 an integration process for integrating the previously-produced scintillator and the photodetecting unit before or after the substrate peel-removal process.

2. A method of manufacturing a radiological image detection apparatus having: a scintillator that emits fluorescence upon exposure to radiation; and a photodetecting unit disposed on a radiation entrance side of the scintillator, the method comprising:
 a photodetecting unit production process for layering on a substrate a protective member that exhibits low radiation absorbency than that exhibited by the substrate and forming a thin film portion that detects the fluorescence as an electric signal on the protective member, thereby producing the photodetecting unit;
 a scintillator production process for forming the scintillator on the thin film portion of the photodetecting unit and placing a support member on another side of the scintillator with respect to its side facing the thin film portion; and
 a substrate peel-removal process for peeling and eliminating the substrate from the protective member integrated with the scintillator in the scintillator production process.

3. The method of manufacturing the radiological image detection apparatus according to claim 1, wherein:

the protective member is provided in such a way that an Al equivalent weight with respect to X-ray emitted at a tube voltage of 60 kV is under 1.8 mm.

4. The method of manufacturing the radiological image detection apparatus according to claim 1, wherein:
in the photodetecting unit production process, the protective member is layered on the substrate by way of a peel layer.

5. A radiological image detection apparatus comprising:
a scintillator that emits fluorescence upon exposure to radiation; and
a photodetecting unit disposed on a radiation entrance side of the scintillator, wherein:
the photodetecting unit includes a protective member formed from a low radiation absorbent material that exhibits low radiation absorbency than that exhibited by a glass material and a thin film portion that is formed on a side of the protective member facing the scintillator and that detects the fluorescence as an electric signal,
wherein the protective member includes a resin layer and a light reflection layer that is made of metal provided on a radiation entrance side of the resin layer, and
in an order from a radiation entrance side of the radiological image detection apparatus, the light reflection layer, the resin layer, the thin film portion and the scintillator are arranged.

6. The radiological image detection apparatus according to claim 5, wherein:
an Al equivalent weight of the protective member with respect to X-ray emitted at a tube voltage of 60 kV is under 1.8 mm.

7. The radiological image detection apparatus according to claim 6, wherein:
an Al equivalent weight of the protective member with respect to X-ray emitted at a tube voltage of 60 kV ranges from 0.1 mm to 1.0 mm.

8. The radiological image detection apparatus according to claim 5, wherein:
the metal is at least one of single metals Al, Mg, Cr, Zr, Ti, and Mn, oxides thereof, and alloys including the respective single metals.

9. The radiological image detection apparatus according to claim 5, wherein:
the resin is at least one of polyimide, polyethylene naphthalate, polystyrene, and aramid.

10. The radiological image detection apparatus according to claim 5, wherein:
at least a part of the thin film portion is formed from an amorphous oxide or an organic material.

11. The radiological image detection apparatus according to claim 5, wherein:
a thickness of the protective member ranges from 0.01 mm to 1 mm.

12. The radiological image detection apparatus according to claim 5, wherein:
the scintillator includes a columnar portion formed from a group of columnar crystals resulting from columnar growth of fluorescent crystal.

13. The radiological image detection apparatus according to claim 12, wherein:
a non-columnar portion including non-columnar crystals is provided at an end of the columnar crystals of the scintillator.

14. The radiological image detection apparatus according to claim 5, wherein:
another side of the protective member with respect to its side on which there is formed the thin film portion corresponds to a peel surface of the protective member achieved when the protective member is peeled off from the substrate that has supported the protective member.

15. A radiographic imaging cassette comprising;
the radiological image detection apparatus according to claim 5; and
a housing that has a top plate on which a subject is to be put, wherein:
the housing houses the radiological image detection apparatus in such a way that the thin film portion opposes a back side of the top plate by way of the protective member.

16. The radiographic imaging cassette according to claim 15, wherein:
the protective member is fixed to the top plate.

17. The radiographic imaging cassette according to claim 15, wherein:
Al equivalent weight achieved with respect to X-ray generated at a tube voltage of 60 kV when the protective member and the top plate are used is under 1.8 mm.

18. The radiological image detection apparatus according to claim 5, wherein:
the protective member is in contact with the thin film member.

19. A radiographic imaging cassette, comprising:
a radiological image detection apparatus comprising:
a scintillator that emits fluorescence upon exposure to radiation; and
a photodetecting unit disposed on a radiation entrance side of the scintillator, wherein:
the photodetecting unit includes a protective member formed from a low radiation absorbent material that exhibits low radiation absorbency than that exhibited by a glass material and a thin film portion that is formed on a side of the protective member facing the scintillator and that detects the fluorescence as an electric signal; and
a housing that has a top plate on which a subject is to be put, wherein:
the housing houses the radiological image detection apparatus in such a way that the thin film portion opposes a back side of the top plate by way of the protective member,
the protective member is fixed to the top plate, and
in an order from a radiation entrance side of the radiographic imaging cassette, the top plate, the protective film, the thin film portion and the scintillator are arranged.

20. The radiographic image cassette according to claim 19, wherein
the protective member and the top plate are entirely in close contact with each other by way of an adhesive layer.

* * * * *